(12) United States Patent
Yamaguchi

(10) Patent No.: US 8,251,547 B2
(45) Date of Patent: Aug. 28, 2012

(54) EMISSION DEVICE, SURFACE LIGHT SOURCE DEVICE AND DISPLAY

(75) Inventor: Masao Yamaguchi, Kitamoto (JP)

(73) Assignee: Enplas Corporation, Kawaguchi-Shi (JP)

( * ) Notice: Subject to any disclaimer, the term of this patent is extended or adjusted under 35 U.S.C. 154(b) by 112 days.

(21) Appl. No.: 12/289,797

(22) Filed: Nov. 4, 2008

(65) Prior Publication Data
US 2009/0116245 A1    May 7, 2009

(30) Foreign Application Priority Data
Nov. 7, 2007    (JP) ................... 2007-289732

(51) Int. Cl.
*F21V 3/02*    (2006.01)

(52) U.S. Cl. ............ 362/311.02; 362/311.01; 362/307; 362/309

(58) Field of Classification Search ............ 362/97.3, 362/237, 326, 332, 335–340, 307–309, 311.01–311.02; 257/98; 349/69; 359/737–738, 742, 708, 359/713–718, 726
See application file for complete search history.

(56) References Cited

U.S. PATENT DOCUMENTS

| | | | | |
|---|---|---|---|---|
| 5,577,492 A * | 11/1996 | Parkyn et al. | ................. | 126/698 |
| 6,097,549 A * | 8/2000 | Jenkins et al. | ................. | 359/726 |
| 7,348,723 B2 * | 3/2008 | Yamaguchi et al. | .......... | 313/501 |
| 7,621,657 B2 * | 11/2009 | Ohkawa | ................... | 362/311.01 |
| 2003/0075167 A1* | 4/2003 | Minano Dominguez et al. | ............. | 126/680 |
| 2006/0066218 A1 | 3/2006 | Yamaguchi et al. | | |
| 2008/0013322 A1 | 1/2008 | Ohkawa | | |
| 2008/0210962 A1 | 9/2008 | Blumel et al. | | |
| 2009/0052192 A1 | 2/2009 | Kokubo et al. | | |
| 2011/0085336 A1 | 4/2011 | Blümel et al. | | |

FOREIGN PATENT DOCUMENTS

| | | |
|---|---|---|
| DE | 102005020908 | 5/2005 |
| EP | 1641052 | 3/2006 |
| EP | 1850166 | 10/2007 |

(Continued)

OTHER PUBLICATIONS

Extended European Search Report issued Oct. 21, 2011 in corresponding European Application No. 08168091.0 (6 pages)

*Primary Examiner* — Robert May
(74) *Attorney, Agent, or Firm* — Staas & Halsey LLP

(57) ABSTRACT

A light flux control member has a back face provided with a recess and a ring-like-recess-portion surrounding the recess. Output light of a point-like-light-source (light emission element) is incident to the recess and the ring-like-recess-portion. Incident light to the recess is emitted from a light control emission face after inner-propagation. Incident light to the ring-like-recess-portion is refracted as to hardly generate inner-propagation light deflected to directions near to a direction of reference optical axis L, resulting in outgoing from any part of the light control emission face, or, if some outgoing occurs from the light control emission face, such outgoing occurs only at an outer periphery portion of the light control emission face. As a result, illumination light quality is avoided from being reduced by appearance of conspicuous ring-like bright part. In addition, uniform illumination light can be supplied to a broad angle range. Even if a plurality of point-like-light-sources are arranged at intervals, respective light fluxes originated from respective point-like-light-sources are well mixed.

19 Claims, 20 Drawing Sheets

FOREIGN PATENT DOCUMENTS

| | | |
|---|---|---|
| EP | 2023038 | 2/2009 |
| JP | 59-226381 | 12/1984 |
| JP | 63-6702 | 1/1988 |
| JP | 2001-250986 | 9/2001 |
| JP | 2002-49326 | 2/2002 |
| JP | 2007-141113 | 9/2007 |

* cited by examiner

UP ↕ DOWN

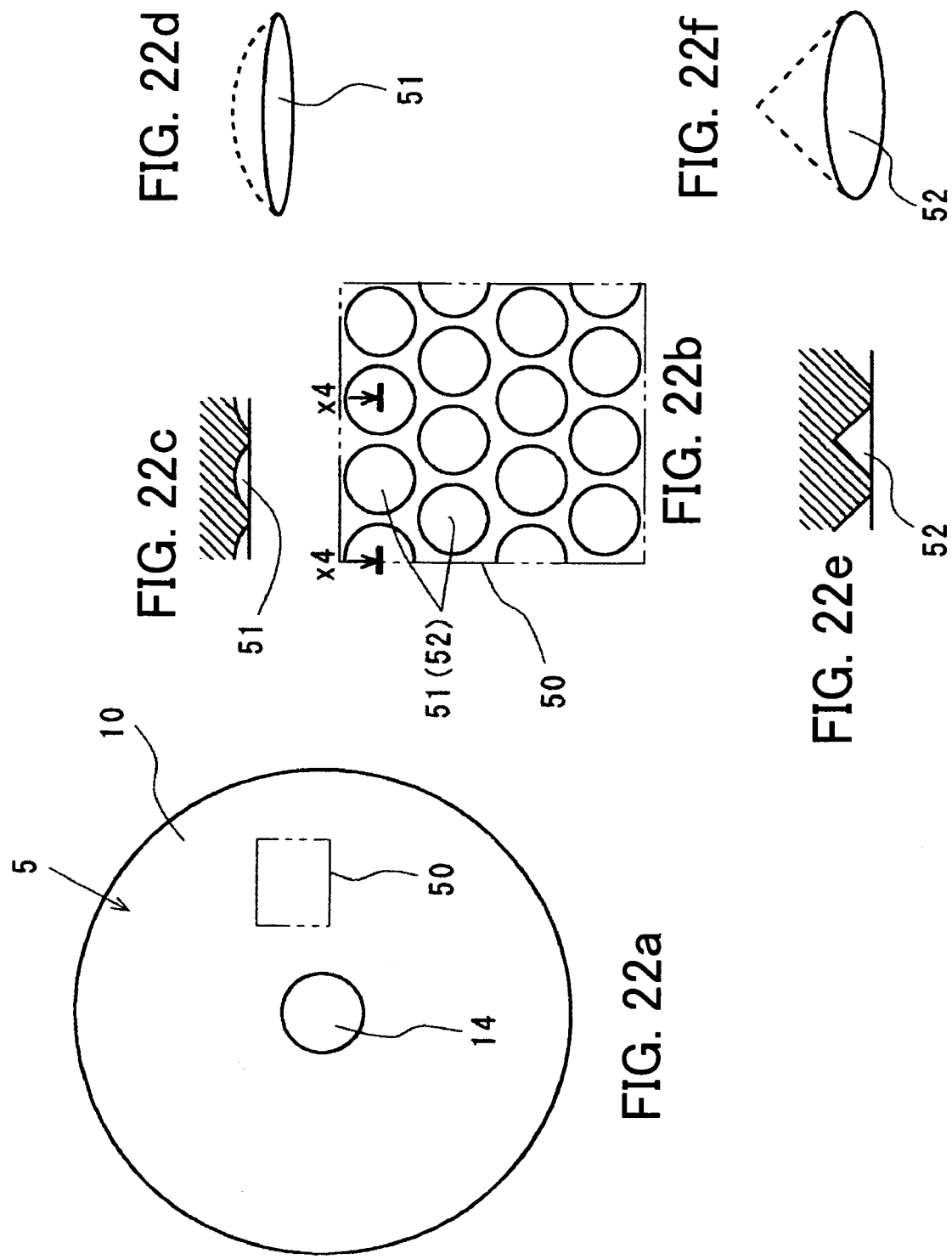

EMISSION DEVICE, SURFACE LIGHT SOURCE DEVICE AND DISPLAY

CROSS REFERENCE TO RELATED APPLICATION

This application claims the benefit of Japanese Application No. 2007-289732, filed Nov. 7, 2007 in the Japanese Patent Office, the disclosure of which is incorporated herein by reference.

BACKGROUND

1. Field of Invention

The present invention relates to an emission device, a surface light source device and a display, being applied to various devices such as emission devices for backlight arrangement of liquid crystal display panel or general uses of illumination, for example, interior illumination, The present invention is also applied to surface light source devices employing emission devices and displays employing combination of emission device and object-to-be-illuminated for displaying.

2. Related Arts

It has been broadly known to employ a surface light source device provided with a plurality of point-like-light-sources as an illumination means for liquid crystal display monitor of devices such as personal computer or television set. A popular point-like-light-source is LED (Light Emitting Diode). According to typical arts, such a surface light source device used for illuminating a LCD-panel of LCD-monitor is provided with a plurality of LEDs and a plate like light flux control member size and shape of which are generally the same as those of the LCD-panel.

The LEDs are disposed like a matrix on the back face side of the light flux control member. Light from LEDs enters into the light flux control member from the back face side thereof, being emitted an emission face opposite to the back face of the light flux control member after travelling within the light flux control member. The emitted light is supplied to LCD-panel for backlighting. Prior arts disclosed in known documents are as follows.

<First Prior Art>

FIG. 17 is a diagram illustrating an example of skeleton structure of surface light source device employing a plurality of LEDs as primary light source. Such skeleton structure is disclosed in Document 1 noted below. Referring to FIG. 17, surface light source device 100 is provided with a plurality of LEDs 101 and micro-lens-array 102. Micro-lens-array 102 consists of micro-lenses arranged in one-to-one correspondence with respect to LEDs 101. Light from EDs 101 is emitted upward in the illustration through micro-lens-array 102.

<Second Prior Art>

FIG. 18 is a diagram illustrating an example of skeleton structure of emission display employing a LED as primary light source. Such skeleton structure is disclosed in Document 2 noted below. Referring to FIG. 18, emission display 103 is provided with LED 104, concave lens 105 and convex lens 106. Light from ED 104 is converged by convex lens 106 after being diverged by concave lens 105, being emitted to directions generally parallel to an optical axis of LED 104.

<Third Prior Art>

An known display employing a LED is disclosed in Document 3 noted below. FIG. 19 shows an arrangement in display 107 for illumination. The arrangement comprises LED 108, converging lens 110 and diverging lens 111. Light from LED 108 is converged by converging lens 110 to be directed forward, then being diverged by diverging lens 111.

<Forth Prior Art>

FIG. 20 shows an example of arrangement including an object-to-be-illuminated in a display employing LEDs as primary light source. Referring to FIG. 20, display 121 is provided with a plurality of LED chips 125, light diffusion member 126 and object-to-be-illuminated (such as LCD-panel) 127. Each LED chip 125 is provided with LED 124. Light flux control member 123 provided with a hemisphere emission face 122 is fixed to a light emitting surface side of LED 124. Light from each LED chip is supplied to object-to-be-illuminated (such as LCD-panel) 127 after transmitting light diffusion member 126. Thus object-to-be-illuminated 127 is illuminated two-dimensionally.

<Fifth Prior Art>

FIG. 21 illustrates another example of display employing a LED as primary light source. Referring to FIG. 21, matrix-type display 130 is provided with display panel substrate 131, emission elements 132 arrayed thereon like matrix and lens case 133. Lens case 133 is located at a front side of emission elements 132, being mounted as to be in closely contact with display panel substrate 131. Hemisphere-like projection portions 134 are formed on lens case 133 as to correspond respectively to emission elements 124. Hollow 135 is formed within each projection portion 134 for accommodating emission element 132. Each hollow 135 has a side wall which is formed so refract and take in light from emission element 132 so that light thus taken in is directed to a front side (upward direction in FIG. 21). Light from emission element 132 impinges only on an inner surface of hollow 135.

Lens case 133 also has gap(s) 136 aground hollow(s) 135 accommodating emission element(s) 132. Light taken in lens case 133 after being emitted sideways from emission element(s) 132 is totally-reflected by slope(s) 137 of gap(s) 136, being directed to a frontal direction. As a result, matrix-type display 13 provide a frontal illumination of an increased brightness.

However, the above-described prior arts involves problems as discussed bellow.

Regarding first prior art (surface light source device 100:

Emission quantity varies rapidly at parts at which configuration of micro-lens arrays 102 is discontinuously changes and intermediate sections between LEDs 101 side by side are formed. This causes boundary areas between micro-lens arrays 102 to provide conspicuous emission brightness unevenness.

Regarding second prior art (emission display 103):

Continuously arranged plural concave lenses 105 connected to each other are not employed. Further, continuously arranged plural convex lenses 106 connected to each other are not employed. Accordingly, it is difficult to illuminate a large area size object-to-be-illuminated uniformly in a backlighting arrangement.

Regarding third prior art (display 107):

Light from LED 108 is affected by converging lens 110 and diverging lens 111 successively. Such successive converging action and diverging action will decrease brightness unevenness as compared with surface light source device 100 (first prior art). However, light from LEDs 108 adjacent to each other is hardly mixed well. Therefore, if LEDs 108 adjacent to each other have emission colors, emission color unevenness between LEDs 108 adjacent to each other tends to be conspicuous.

Regarding forth prior art (display 121):

Large wave-like brightness unevenness of illumination light appears as to correspond to cyclic locations of LEDs

124. This is illustrated in FIG. 11. This brings dark parts at intermediate sections between LEDs 124 adjacent to each other, rendering uniform illumination difficult. In addition, directions light fluxes outputted from each LED chip 125 tend to gather neighbourhood of an optical axis of LED 124 corresponding to each LED chip 125. Such phenomenon is like that observed in a case where an object-to-be-illuminated is directly illuminated by an emission element as shown bay curve S3 in FIG. 11. This results in difficulty such that light fluxes from LEDs 124 adjacent to each other are hardly mixed each other and unevenness in emission color is apt to conspicuous.

Regarding fifth prior art (matrix-type display 130):

Brightness of frontal illumination light is large. However, light fluxes from lens cases 133 of emission elements 132 adjacent to each other tend to be hardly mixed together. This brings conspicuous unevenness in emission color. In addition, light H emitted from projection portion 134 of lens case 11133 and light H emitted after being totally reflected by slope 137 of gap 136 give a crossover at a location which would be seen easily by naked eyes. As a result, a ring-like locally bright portion can be generated. Such a ring-like locally bright portion would decrease illumination quality.

Saying further, heat generated by emission elements 132 are hardly radiated because emission device 138 is completely covered by lens cases 133. Therefore, electric components mounted on LCD-panel substrate 131 is apt to be affected by heat.

In addition, some mounting errors can occur in mounting of lens cases 133 to LCD-panel substrate 131 easily, resulting in generation of a gap between lens cases 133 and LCD-panel substrate 131. Such a gap will increase the possibility such that any light enters into lens cases 133 from parts other than the gap. The fifth prior art fails to overcome such undesirable possibility.

Document 1; Tokkai 2002-49326 (JP:See paragraph 0015 and FIG. 4)
Document 2; Tokkai-Sho 59-226381 (JP:See page 3 left-upper column line 15 to right-upper column line 2 and FIG. 6)
Document 3; Tokkai-Sho 63-6702 (JP:See page 2 right-upper column line 20 to left-lower column line 4 and FIG. 3)
Document 4; Tokkai 2001-250986 (JP:See FIG. 1)

OBJECT AND SUMMARY OF INVENTION

The present invention can be applied to an emission device employing a mode according to which light of an emission element is emitted from a light flux control member, a surface light source device employing the mode in which one or more emission elements are adopted and a display using the surface light source device as an illumination means.

An object of the present invention is to improve such emission device, surface light source device and display so that uniform two-dimensional illumination is realized and, if a back side area of a light flux control member can function as an incidence face, unevenness in emission color is avoided from being conspicuous.

Another object of the present invention is to improve such emission device, surface light source device and display employing a single emission element as a light source (primary light source) so that light of the emission element can be diverged effectively, smoothly and broadly enough to reach a desired range.

First, the present invention is applied to an emission device comprising at least one point-like-light-source and a light flux control member having a back face to which an output light flux of said point-like-light-source is incident and an emission face which is opposite to said back face and outputs illumination light forming a three-dimensional emission flux a travelling direction at a center of which is defined as reference optical axis.

According to a fundamental feature of the present invention, said emission face includes a light control emission face controlling emission of said illumination light, and said back face includes a first recess portion formed at location corresponding to said point-like-light-source and at least one second recess portion located in an area surrounding an opening-edge of said first recess portion, said second recess portion being configured as to be capable of restraining refraction on incidence of light of said point-like-light-source to said second recess portion from generating inner-propagation light having a travelling direction approaching said reference optical axis.

Further, said light control emission face is configured as to meets the following conditions (a), (b) and (c) regarding light emitted in a direction range which is at least within 75° from a maximum intensity light emission direction of said point-like-light-source, so far as out of a neighbour of said reference optical axis, under definition such that θ1 is angle of inner-propagation direction after incidence to said light flux control member with respect to a direction parallel with said reference optical axis and emission angle θ5 is angle of emission from said light control emission face with respect to a direction parallel with said reference optical axis, (a) {θ5/θ1}>1 is satisfied;
(b) θ5 gets larger with increasing of θ1, and
(c) increasing quantity of θ5 relative to increasing quantity of θ1 gets smaller as θ1 gets larger.

Said second recess portion may be a ring surrounding said first recess portion.

in addition, said second recess portion may have a triangle-like cross section shape on a plane on which said reference optical axis extends and consists of a ring-like first slope adjacent to said first recess portion and a ring-like second slope which is located outside of said first recess portion and connects an end portion of said first slope with said back face.

It is noted that said first slope may be formed as to either extend on an extended part of straight line running between an emission center of said point-like-light-source and the other end portion of said first slope or be formed at a sharper angle as compared with inclination of said extended part of straight line so that light which has reached said second recess portion after being emitted from said point-like-light-source is not hindered from being incident to said second slope.

Further, said first slope may be formed as to be extend, in said cross section shape on said plane, on an extended part of strayed line running between an emission center of said point-like-light-source and said the other end portion of said first slope, and said second slope is formed as to be generally vertical with respect to said first slope.

Furthermore, said at least one second recess portion may consist of a set of second recess portions, said set of second recess portions being arranged concentrically and successively as to surround said first recess portion, and all of said set of second recess portions except for one second recess portion that is located at the most inner side and is adjacent to said opening-edge of said first recess portion being configured as to be the same as or similar to said one second recess portion.

Alternatively, said at least one second recess portion may consist of a set of second recess portions, said set of second recess portions being arranged concentrically and successively as to surround said first recess portion, and all of said set of second recess portions except for one second recess portion that is located at the most inner side and is adjacent to said opening-edge of said first recess portion being configured as to have first slope inclination gets gentler increasingly as compared with first slope inclination of said one second recess as distance of second recess portions from said first recess portion increases.

It is noted that said light control emission face may include a ring-like first emission face which is near to said reference optical axis and concentric with respect to said reference optical axis and a second emission face which is adjacent to and surrounds said first emission face, a connection part between said first emission face and said second emission face corresponding to a point of inflection of said light control emission face.

In any of the above emission devices, said at least one point-like-light-source consists of a plurality of point-like-light-sources corresponding to each of which said first recess portion and said at least one second recess portion are formed on said back face of said light flux control member.

Next, the present invention is applied to a surface light source device comprising an emission device and a light diffusion member diffusing light outputted from said emission device.

According to the present invention, the surface light source device employs any of the above emission devices.

The present invention is also applied to a display comprising a surface light source device and an object-to-be-illuminated for displaying illuminated by light outputted from said surface light source device. According to the present invention, the display employs the a According to operation of devices in accordance with the present invention, a large part of light fluxes outputted from one or more point-like-light-sources enters into a light flux control member through a first recess portion(s) formed on a back face of the light flux control member, becoming inner-propagation light. Such inner-propagation light is emitted from a light control emission face of the light flux control member.

On the other hand, some part of light fluxes outputted from one or more point-like-light-sources (light largely inclined with respect to the reference optical axis) enters into the light flux control member through a second recess portion(s) formed on around the first recess portion(s). Refraction occurs on incidence to the second recess portion(s) as to restrain inner-propagation light travelling in directions nearing to directions parallel to the reference optical axis from being generated. Such an effect is owing to configuration of the second recess portion(s).

In other words, inner-propagation generated by incidence to the second recess portion(s) is not emitted through the light control emission face, or, even if some light component is emitted through the light control emission face happens, it occurs only at a distal end portion of the light control emission face (only at an area very far from the reference optical axis).

As a result, reduction in illumination quality is avoided from being caused by appearance of ring-like locally bright part, and illumination light is outputted from light control emission face uniformly, effectively and broadly.

Particularly, in cases of employing a plurality of emission elements as primary light sources, light from the respective emission elements can be mixed easily. This prevents illumination light emitted from the light flux control member from showing conspicuous illumination color unevenness even if unevenness in emission color exists among the emission elements. Besides, emission brightness is uniformalized and high quality illumination is obtained.

In addition, in cases where the whole area of a back face of light flux control member functions as an incidence face, high quality illumination is possible. If a light flux control member is disposed at a location distant from a point-like-light-source(s) by a practical distance, high quality illumination is obtained and heat generated by the emission element(s) is prevented from exerting a bad influence.

BRIEF DESCRIPTION OF DRAWINGS

FIGS. 22a through 22f illustrate a light flux control members employed in another modification in accordance with the present invention, FIG. 22a illustrating a back face of the same light flux control member, FIG. 22b being a partially enlarged illustration of a part of back face of the same light flux control member, FIG. 22c being a cross section view of a first example of second recess (a cross section view of a hemisphere-like recess along x4-x4 in FIG. 22b), FIG. 22d being a perspective view of the second recess shown in FIG. 22c, FIG. 22e being a cross section view of a second example of second recess (a cross section view of a conical-like recess along x4-x4 in FIG. 22b) and FIG. 22f being a perspective view of the second recess shown in FIG. 22e.

EMBODIMENT

Described below is on embodiments in accordance with the present invention.

<Outlined Structure of Surface Light Source Device and Display>

Figure 1:
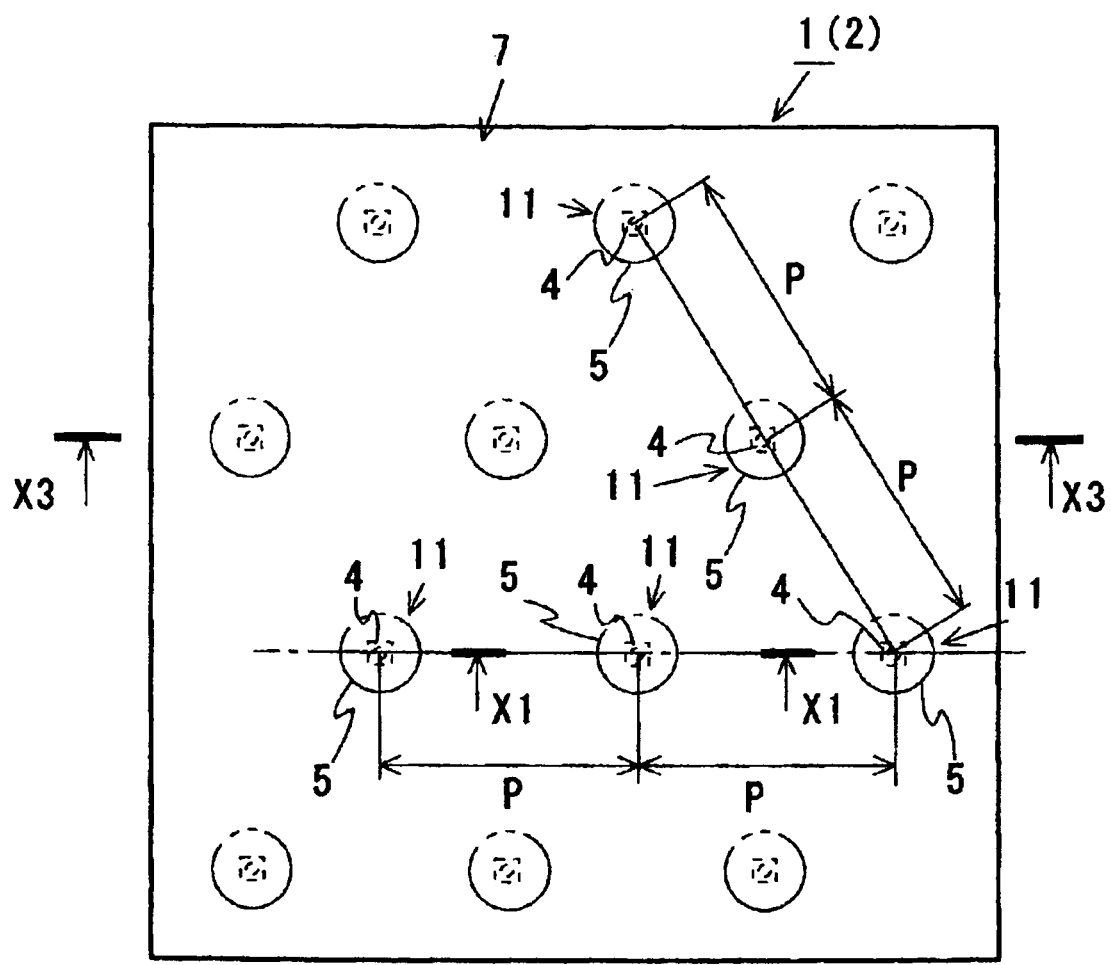
FIG. 1 is a plan view of a surface light source device and a display provided with the same to which the present invention can be applied, with a object-to-be-illuminated and a light diffusion member being not shown.
Figure 2:
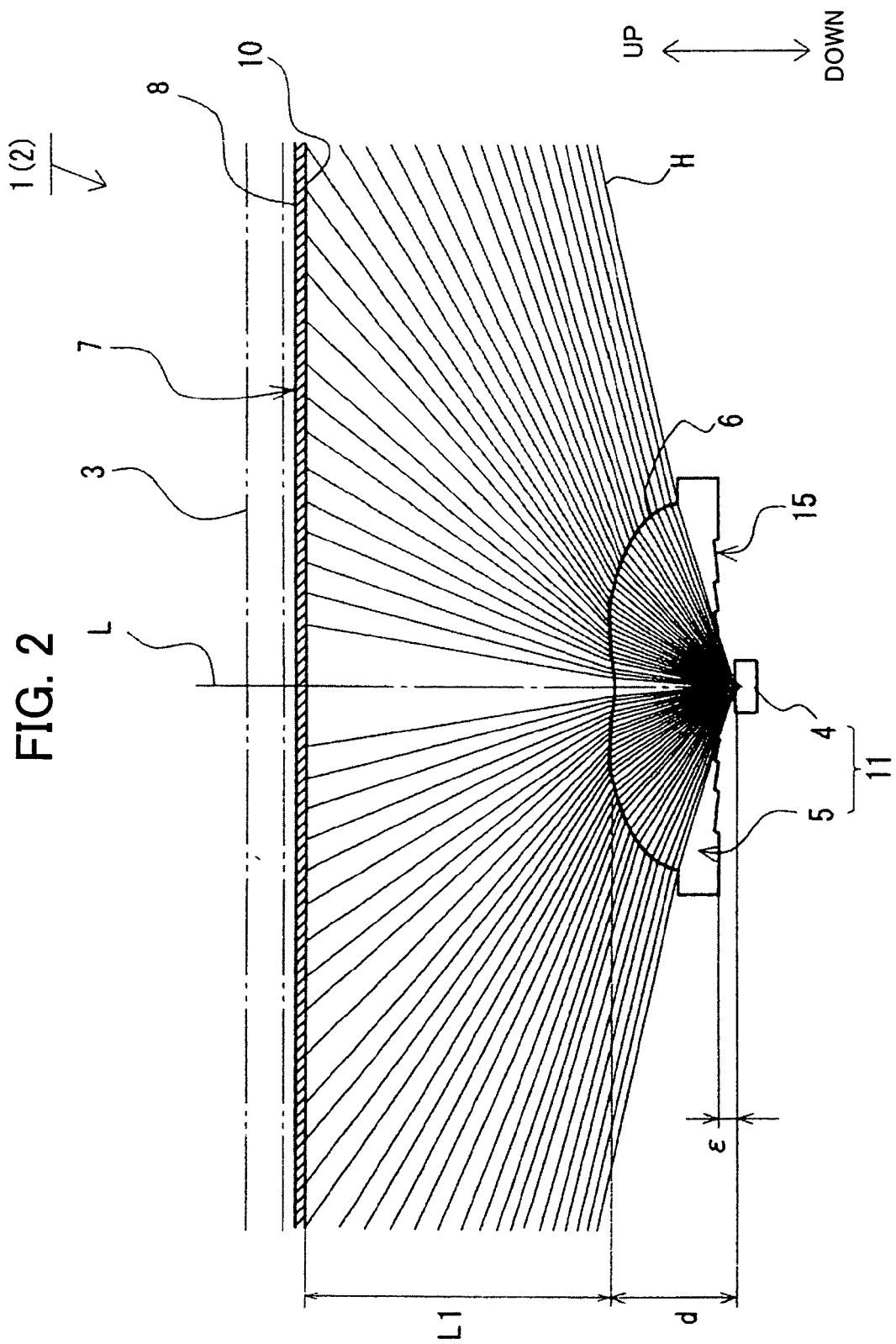
FIG. 2 is a cross section view of the display along line X-X in FIG. 1.
Figure 3:
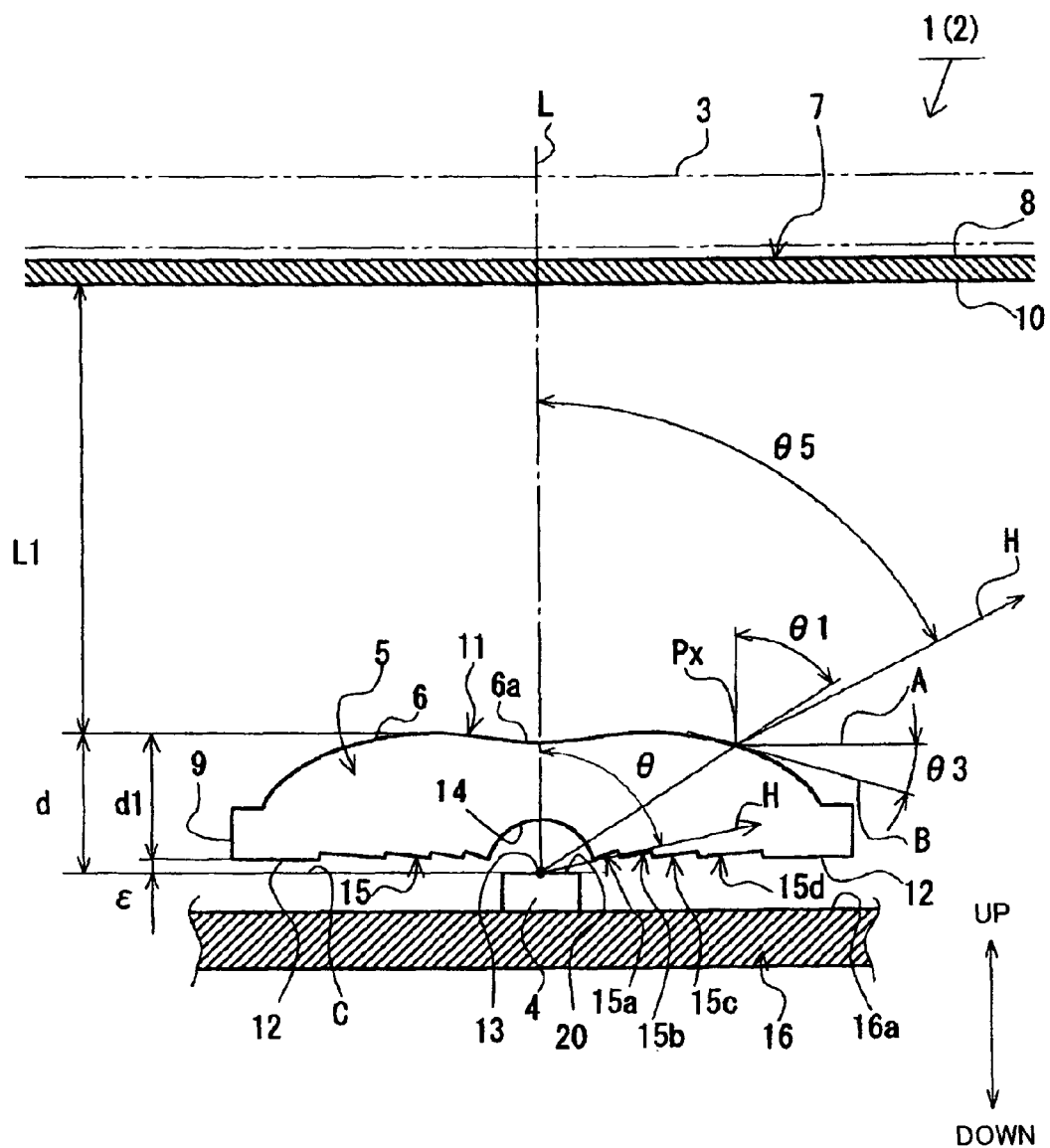
FIG. 3 is a partial cross section view of the display along a cross section including optical axis of a LED, giving a partially enlarged illustration of FIG. 2.

FIGS. 1 to 3 illustrate display 1 and surface light source device 2 employed therein, which are in accordance with the present invention. FIG. 1 is a plan view of surface light source device 2, In other words, a plan view of display 1, with elements including a object-to-be-illuminated (such as LCD-panel) 3 being removed. FIG. 2 is an outlined cross section view of display 1 along line X-X in FIG. 1. FIG. 3 is a partially enlarged cross section view of display 1 shown in FIG. 2 along a cross section including reference optical axis of emission element 4, giving an illustration of configuration of light control emission face 6 of light flux control member 5.

It is noted that "reference optical axis L" is defined as "light travelling direction at a center of a three-dimensional emission flux emitted from an emission device". In addition, "optical axis of emission element 4 is defined as "light travelling direction at a center of a three-dimensional emission flux emitted from emission element 4". Described is on cases where optical axis of emission element 4 accords with reference optical axis L. Accordingly, reference optical axis L is expressed by "optical axis L" hereafter.

Referring to FIGS. 1 to 3, display 1 comprises a plurality of emission elements (point-like-light-sources such as LEDs) 4 as primary light source, light flux control member 5, plate-like light diffusion member 7 and object-to-be-illuminated 3. According to the embodiment, surface light source device 2 is constituted by emission elements 4, light flux control member 5, light diffusion member 7. Emission device 1 is constituted by emission elements 4 and light flux control member 5.

Light diffusion member 7 has a rectangular plan shape, being provided with an emission face (front face) 8 and back face 12 as major faces. Emission elements 4 are disposed at generally constant intervals (at generally constant pitch) along back face side of light diffusion member 7 together with light flux control member 5. Object-to-be-illuminated 3 is disposed at front side of light diffusion member 7.

<Light Flux Control Member>

(1) Outlined Configuration and Mounting State)

Figure 4A:
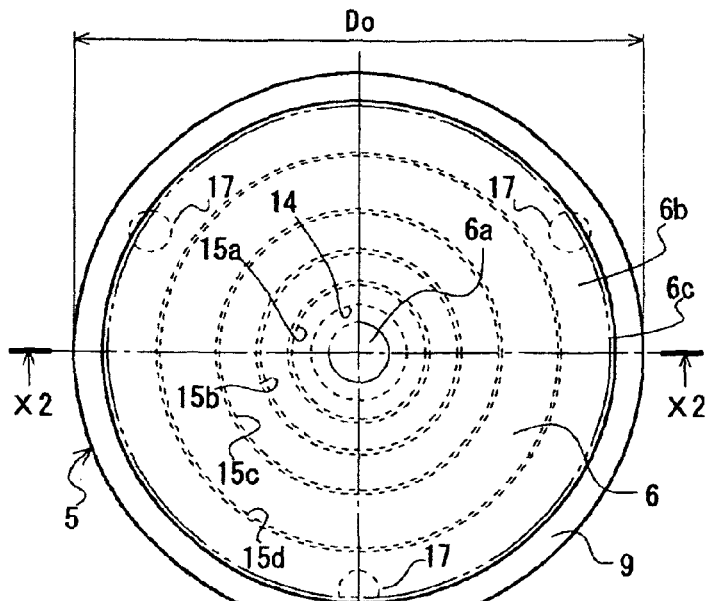
FIGS. 4a to 4c illustrate details of a light flux control member employed in an embodiment in accordance with the present invention, FIG. 4a being a plan view, FIG. 4b being a cross section view along line X2-X2 in FIG. 4a, and FIG. 4c being a partially enlarged illustration of a part of back side of the light flux control member (a part of FIG. 2)
Figure 4B:
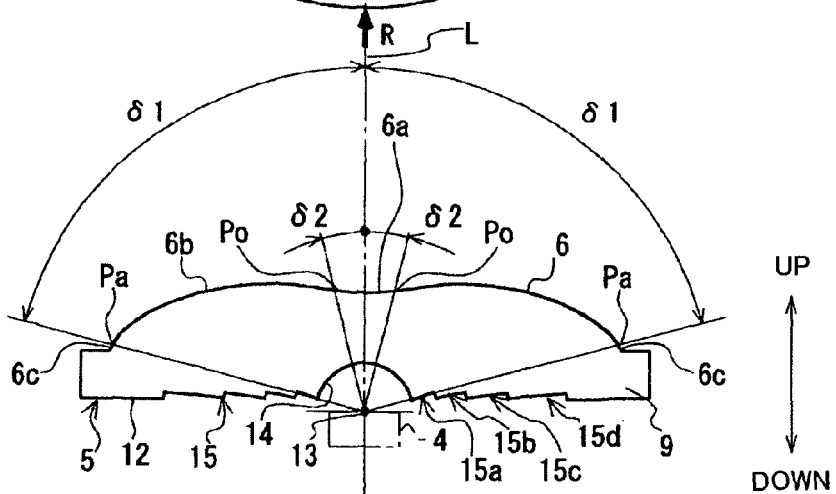

Light flux control member 5 is configured as illustrated in FIGS. 1 to 3, being made of transparent resin material such as PMMA (polymethyl methacrylate), PC '(polycarbonate) or EP (epoxy resin), or transparent glass. As shown in FIG. 4a, light flux control member 5 has light control emission face 6 and generally ring-like flange portion 9. light control emission face 6 has a generally circular plan shape. Ring-like flange portion 9 is formed as to projects toward the outside of light control emission face 6. As shown in FIG. 4b, light control emission face 6 is formed as to project upward as compared with flange portion 9.

Figure 4C:
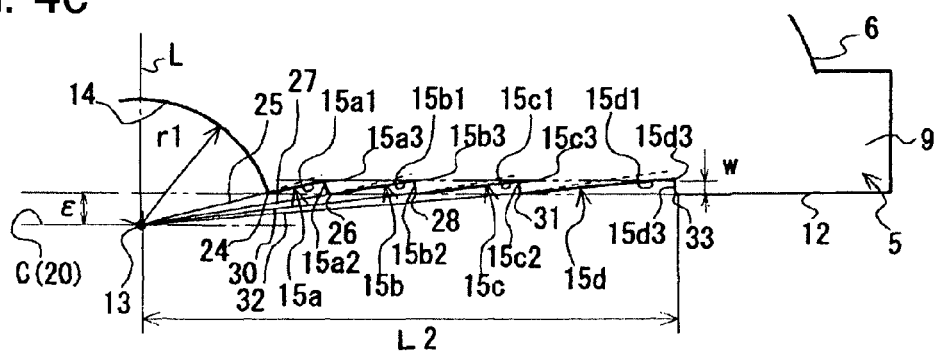

Now, for the sake of description, "emitting point 13" is defined as a point at which optical axis L and an upper face (emitting surface) 20 of emission element 4 cross. On the side of back face 12 of light flux control member 5 are formed recess portions 14 as first recess portions. As shown in FIG. 4b. each recess portion 14 is located as to correspond to each emission element 4. Recess portion 14 is configured like a hemisphere a center of which is emitting point 13, having radius of r1. As shown in FIGS. 4a to 4c, a plurality of ring-like-recess-portions 15a to 15d are formed on the side of back face 12 as to surround concentrically and successively a periphery of recess portion 14.

Figure 5A:
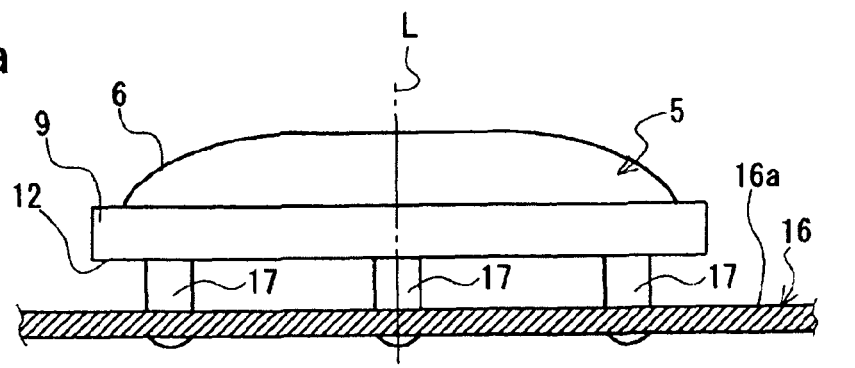
FIGS. 5a and 5b illustrate mounting state of the light flux control member, FIG. 5a being a side view of an emission element as viewed from R-direction in FIG. 4a, FIG. 5b being a cross section view showing an engaging state of feet of the light flux control member with mounting holes provided by substrate.
Figure 5B:
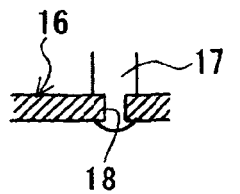

In addition, as shown in FIGS. 4a and 5, three feet 17 are formed at constant intervals on the side of back face 12 along a periphery of the most outside ring-like recess portion 15 as to be located more distant from recess portion 14 as compared with ring-like recess portion 15. In other words, feet 17 are arranged on a circle concentric with the outermost ring-like recess portion 15d.

Feet 17 are round-rod-like members which are utilized from mounting light flux control member 5 to substrate 16, with light flux control member 5 being positioned. Three feet 17 are engaged onto mounting holes 18 opened toward upper face 16a of substrate 16. Upper face 16a is opposite to light flux control member 5. Three mounting holes 18 are arranged at constant intervals on a circle center of which is emitting point 13. Light flux control member 5 can be secured as to be positioned with respect to emitting point 13 of emission element 4 by causing feet 17 to be engaged into mounting holes 18. It is noted that both a center of light flux control member 5 and emitting point 13 are located on optical axis L.

Gap $\epsilon$ is generated between light emitting face 20 of emission element 4 and back face 12 of light flux control member 5 by mounting light flux control member 5 to substrate 16. Such gap $\epsilon$ can be brought by mounting error which involved by a process such that light flux control member 5 is mounted to substrate 16 as to cause emission element 4 to be accommodated into recess portion 14. Gap $\epsilon$ may be formed in order to promote diffusion of heat generated by emission element 4.

In the embodiment, each foot 17 is fat at a root side thereof and thin at a topside 6 thereof, providing a fat portion near to a root of foot 17 and a thin portion near to a top of foot 17.

Each mounting hole 18 has a diameter that does not allow a fat portion of foot 17 to pass and allows a thin portion of foot 17 to pass, being formed as to penetrate substrate 16.

Thin portions of feet 17 are pushed into mounting holes 18 so that top portions of feet 17 reach lower face 16b of substrate 16 and extrude therefrom. Then the top portions are heat-deposited to position light flux control member 5 with respect to substrate 16. It is noted that "close-fit" may be applied to fitting of feet 17 into mounting holes 18 or adhesive may be applied to fixing of feet 17 to mounting holes 18 if the device is used under circumstance tending to cause light flux control member 5 to fall away from substrate 16.

(2) Details of Light Control Emission Face of Light Flux Control Member

Light control emission face 6 of light flux control member 5 consists of first emission face 6a and second emission face 6b. First emission face 6a occupies a predetermined area through a center of which optical axis L extends. Second emission face 6b is formed around first emission face 6a as to be continuously connected to first emission face 6a. As understood from surface configuration illustrated in FIG. 4b, first emission face 6a has a curved surface sinking downward smoothly, namely, a downward-convex smooth curve, providing a recess shape like a shape which is obtained by cutting out and picking up a part of sphere.

On the other hand, second emission face 6b has a smoothly curved upward-convex surface which is adjacent to first emission face 6a. As shown in FIG. 4a, second emission face 6b has a ring-like plan shape surrounding first emission face 6a. First emission face 6a and second emission face 6b are connected smoothly to each other, providing a connection portion corresponding to point of inflection Po. In other words, point of inflection Po is located at boundary portion between first emission face 6a and second emission face 6b.

As shown in FIG. 4b, a curve showing profile of first emission face 6a and another curve showing profile of second emission face 6b meet at point Po and are connected there to each other. Thus point Po is an inflection point of a continuous curve giving a cross section profile (surface configuration) of light control emission face 6.

Referring to FIGS. 4a and 4b again, third emission face 6c is formed at periphery side of second emission face 6b as to provide a bridging portion between second emission face 6b and flange portion 9. It is noted that a generally straightly inclined slope forming third emission face 6c shown in FIG. 4b is merely an example. Third emission face 6c may be formed of a curved slope unless the curved slope is configured as to disturb broad and uniform emission from light flux control member 5.

Now defined are some points, lines, quantities and others as below in connection with FIGS. 3, 4a and 4b. It is noted that "inner-propagation light" means light which propagates within light flux control member 5 after being emitted from emission element 4 and then entering into light flux control member 5.

Connection point Pa; connection point (boundary) between second emission face 6b and third emission face 6c.

δ1; angle of straight line running through emitting point 13 and connection point Pa with respect to optical axis L.

δ2; angle of straight line running through emitting point 13 and inflection point Po with respect to optical axis L.

Reference plane C; horizontal plane (in FIG. 3) which extends through emitting point 13 and vertically with respect to optical axis L.

Point Px; position at which inner-propagation light is emitted from light control emission face 6 (i.e. a crossing point at which light H meets light control emission face 6 in the cross section plane shown in FIG. 3.

Straight line A; straight line running through point Px and in parallel with reference plane C.

Tangential line B; tangential line of profile line of light control emission face 6 at position Px.

θ; angle of travelling direction of light emitted from emission element 4 with respect to optical axis L.

θ1; angle of travelling direction of light at a reaching point on emission face (light control emission face 6) after being emitted from emission element 4 and then travelling within light flux control member 5 with respect to a straight line which runs through the reaching point and in parallel with optical axis L.

θ3; angle of tangential line B with respect to straight line A.

θ5; Emission angle of inner-propagation light on being emitted from emission face (light control emission face 6)=angle of travelling direction of light (H) emitted from the emission face (light control emission face 6) of light flux control member 5 with respect to optical axis L.

In addition, "maximum intensity direction", "maximum intensity primary light", "maximum intensity". "half-intensity primary light" and "half-intensity angle" are defined as follows in connection with angular characteristics of light intensity.

maximum intensity direction; direction to which light is emitted from emission element 4 most strongly.

maximum intensity primary light; light which is emitted from emission element 4 to maximum intensity direction.

maximum intensity; intensity of maximum intensity primary light half-intensity primary light; light which is emitted from emission element 4 at half maximum intensity.

half-intensity angle; angle of travelling direction of inner-propagation light corresponding to half-intensity primary light with respect to travelling direction of inner-propagation light corresponding to maximum intensity primary light.

It is noted that the present invention is described under provision such that maximum intensity direction substantially accords with direction of optical axis L (normal direction of reference plane C). Usually, such provision is practical and maximum intensity direction can be regarded as the same direction as the direction of optical axis L. In addition, it is provided that emission direction intensity profile (angular characteristics) of emission element 4 is substantially symmetric with respect to optical axis L and a unique half-intensity angle (absolute value) exists.

Under the above definitions, configuration of curved surface of light control emission face 6 shown in FIG. 3 meets the following conditions. In other words, configuration of curved surface of light control emission face 6 is formed as to satisfy the conditions.

Conditions; at least in a predetermined range of θ1, $0<\Delta\leqq\theta1$ (absolute value)<a predetermined angle larger than half-intensity angle, (a) θ5/θ1>1

(b) θ5 increases with increasing of θ1, and (c) increasing quality of θ5(>0) relative to increasing quality of θ1(>0) gets smaller acceding to increasing of θ1.

It is noted that Δ is a small angle expressing being near angularly to a direction of optical axis L. A preferable value of Δ is 5 degrees that defines an angle range of θ1 within ±5 degrees.

Figure 6:
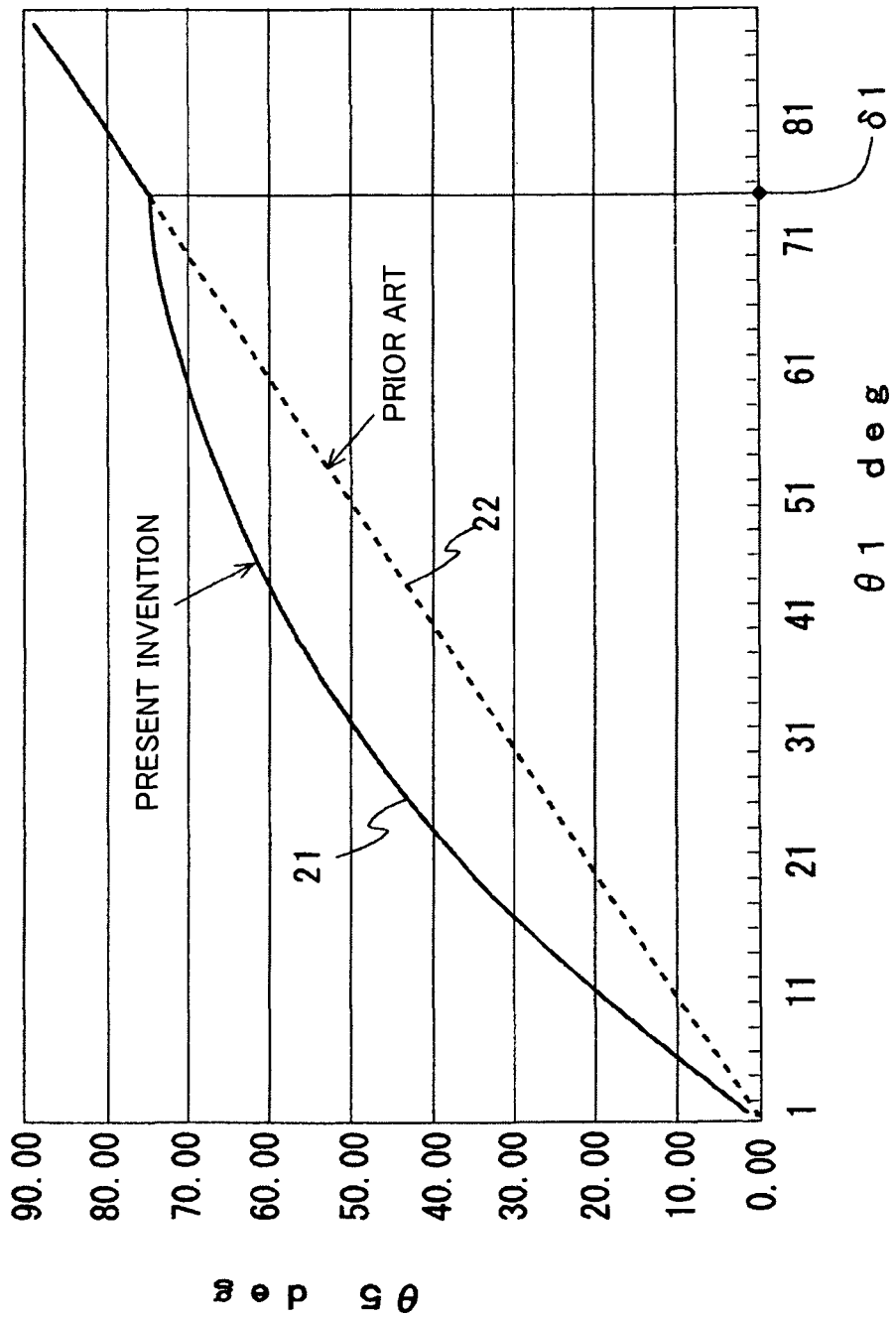
FIG. 6 gives a graphic illustration showing a relation between angle (angle of a travelling direction of light on reaching a point on an emission face of light flux control member with respect to a straight line through the point and paralleled to reference optical axis) θ1 and angle (emission angle of light flux control member) θ5.

FIG. 6 gives a graphic illustration showing a relation between angle θ1 and angle θ5 (β emission angle from light flux control member 5). Referring to FIG. 6, curve 21 gives an example meeting the above conditions. According to this example, the above-mentioned "predetermined angle larger than half-intensity angle" is δ1. A value of δ1 is 75 degrees (δ1=75°).

On the other hand, dotted line 22 shown in FIG. 6 expresses (θ5/θ1)=1.

Now α is defined as coefficient expressing degree of light diffusion performed by light flux control member 5. Angles θ5 and θ3 are given by the following formula (1) and formula (2), respectively, under condition of θ1<δ1.

$$\theta 5=[1+\{(\delta 1-\theta 1)\times\alpha/\delta 1\}]\times\theta 1 \text{ (where } \theta 1 \text{ (absolute value)} < \delta 1) \quad (1)$$

$$\theta 3=\tan^{-1}[(\sin\theta 5 - n\cdot\sin\theta 1)/(\cos\theta 5 - n\cdot\cos\theta 1)] \text{ (where } n=\text{refractive index of light flux control member)} \quad (2)$$

Figure 7:
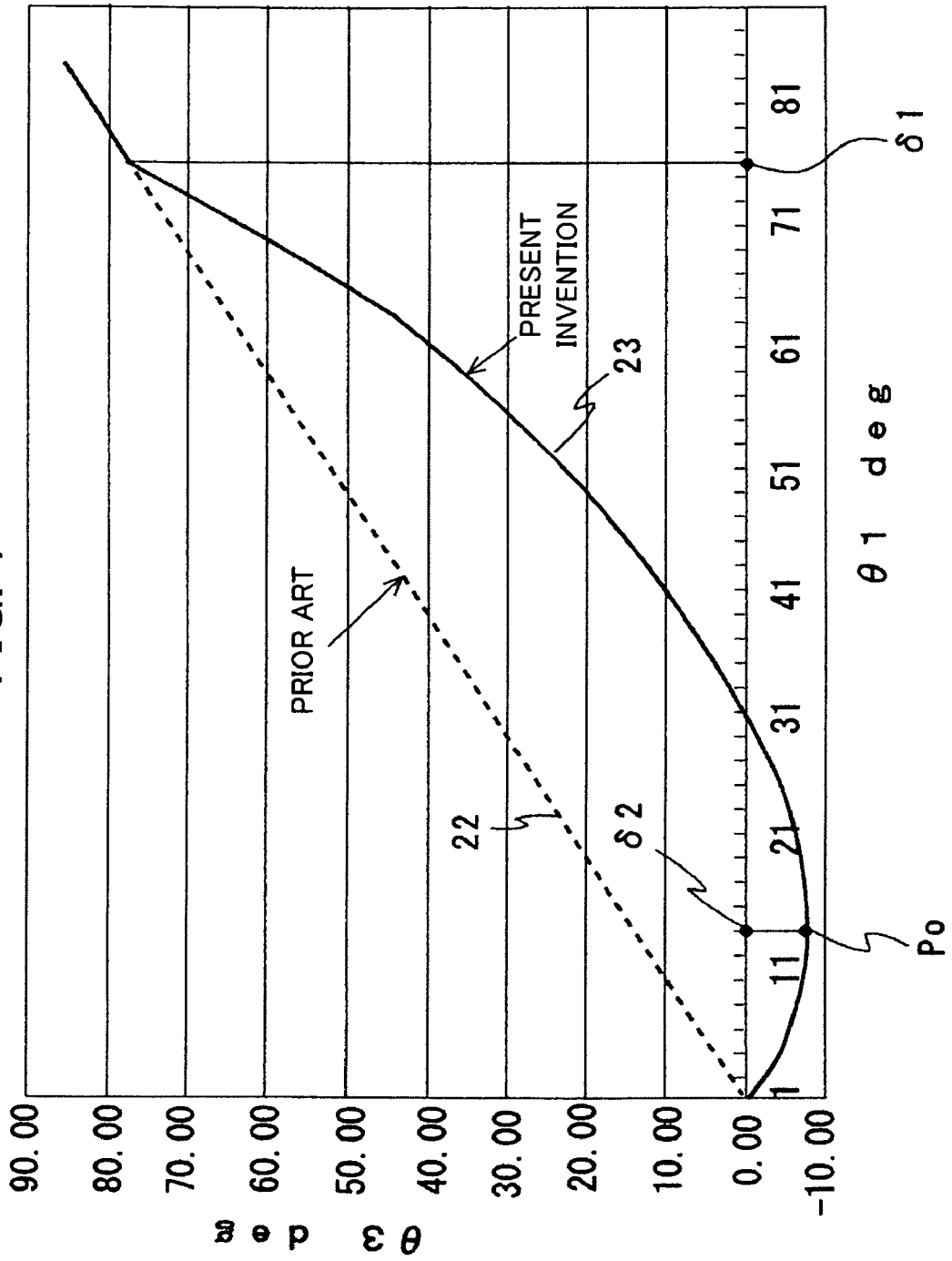
FIG. 7 gives a graphic illustration showing a relation between angle θ1 and lens surface inclination angle of light flux control member θ3.

Substituting above formula (1) for above formula (2), θ3 is expressed as to be regarded as a function of θ1. FIG. 7 gives a graph showing an example of this function. Referring to FIG. 7, curve 23 expresses a relation between θ3 and θ1 determined on the basis of above formulae (1) and (2). Curve 23 teaches the followings.

(i) Angle θ3 gets smaller gradually with increasing of θ1 so far as θ1 ranges from a neighbour of optical axis L to δ2 (until θ1=δ2).
(ii) Angle θ3 gets greater gradually with increasing of θ1 so far as θ1>δ2.
(iii) When angle θ1 accords with δ1, θ3=θ1 is satisfied.

There is light satisfying θ1=θ5 in the vicinity of optical axis L (within a range of θ1 from 0 to ±5 degrees). This prevents a surface-to-be-illuminated from having a locally dark part at a location just above emission element 4 or vicinity thereof. It is noted that optical axis L shown in FIG. 3 accords with the normal direction with respect to reference plane C.

(3) Details of Ring-Like Recess(es) of Light Flux Control Member

As shown in FIGS. 4a to 4c, ring-like recesses 15 formed on back face 12 of light flux control member 5 are composed of first ring-like recess 15a and second to fifth ring-like recesses 15b to 15d. First ring-like recess 15a is formed as to be adjacent to recess portion 14. Second to fifth ring-like recesses 15b to 15d are formed as to successively located in order from inside to outside radially. As shown in FIG. 4c, first ring-like recess 15a has a triangle-like cross section along a plane including optical axis L. It is noted that the plane including optical axis L is vertical to back face 12 of light flux control member. First ring-like recess 15a consists of ring-like first slope 15a1 and ring-like second slope 15a2.

First slope 15a1 is generally located on an extended part of straight line 25 running from emitting point 13 to opening edge 24 of recess portion 14. Second slope 15a2 connects end portion 15a3 of first slope 15a1 to a side of back face 12. End portion 15a3 is an end portion other than opening edge 24 and located at w in depth from back face 12. Second slope 15a2 is generally vertical to first slope 15a1.

It can be said that above sentence "First slope 15a1 is generally located on an extended part of straight line 25 running from emitting point 13 to opening edge 24 of recess portion 14" means either (I) or (II) below.

(I) First slope 15a1 is located on an extended part of straight line 25.
(II) First slope 15a1 is located on a straight line segment which is obtained by rotating the extended part of straight line 25 anticlockwise slightly around a rotation point provided by opening edge in a plane corresponding to the cross section, shown in FIG. 4c, of light flux control member 5. Please see a location denoted by a dotted line in FIG. 4c.

First slope 15a1 is preferably inclined as to hardly receive light which is directly directed to back face 12 after being emitted from emission element 4. Above sentence "Second slope 15a2 is generally vertical to first slope 15a1" is related to the illustration of FIG. 4c, meaning that second slope 15a2 crosses first slope 15a1 at an angle slightly greater or smaller than 90° under consideration of manufacturing error.

Second slope 15a2 is preferably inclined as to restrain light of emission element 4 from being refracted on being incident thereto toward a direction which comes nearer to reference optical axis L as compared with light travelling direction before being incident.

As shown in FIG. 4c, second ring-like recess portion 15b has a triangle-like cross section different from said triangle-like cross section of first ring-like recess portion 15a, consisting of ring-like first slope 15b1 and ring-like second slope 15b2.

Second slope 15b2 connects end portion 15b3 of slope 15b1 with a side of back face 12. End portion 15b3 is an end portion other than back face side end edge 26 and located at w in depth from back face 12. Second slope 15b2 is generally vertical to first slope 15b1.

As shown in FIG. 4c, third ring-like recess portion 15c has a triangle-like cross section different from both triangle-like cross sections of first and second ring-like recess portions 15a, 15b, consisting of ring-like first slope 15c1 and ring-like second slope 15c2.

First slope 15c1 is generally located on an extended part of straight line 30 running from emitting point 13 to back face side end edge 28 of second slope 15b2 of second ring-like recess portion 15b.

Second slope 15c2 connects end portion 15c3 of slope 15c1 with a side of back face 12. End portion 15c3 is an end portion other than back face side end edge 28 and located at w in depth from back face 12. Third slope 15c2 is generally vertical to first slope 15c1.

As shown in FIG. 4c, forth ring-like recess portion 15d has a triangle-like cross section different from every triangle-like cross section of first to third ring-like recess portions 15a to 15c, consisting of ring-like first slope 15d1 and ring-like second slope 15d2.

First slope 15d1 is generally located on an extended part of straight line 32 running from emitting point 13 to back face side end edge 31 of second slope 15c2 of third ring-like recess portion 15c.

Second slope 15d2 connects end portion 15d3 of slope 15d1 with a side of back face 12. End portion 15d3 is an end portion other than back face side end edge 31 and located at w in depth from back face 12. Second slope 15d2 is generally vertical to first slope 15d1.

It is noted that depth w of first to forth ring-like recess portions 15a to 15d and distance L2 from optical axis L to the outermost edge (back face side end edge 33 of second slope 15d2) are preferably determined under consideration of factors such as size of light flux control member 5, emission brightness of emission element 4, gap distance ε from emitting surface 20 of emission element 4 to back face 12 of light flux control member 5 and half-intensity angle of emission element 4, In addition, ring-like recess portions 15 formed on back face 12 of light flux control member 5 as second recess portions in the embodiment work effectively under situation such that emission element 4 emits light including rays which are largely inclined light with respect to optical axis L and incident to back face 12.

Therefore gap distance ε is preferably small so that a great part of the light emitted from emission element 4 is incident to first recess portion 14 and the other part of the light emitted from emission element 4 is incident to second recess portions 15. For example, gap distance ε is preferably formed as to be smaller than radius of opening edge 24 of first recess portion 14.

(4) Operation of Light Flux Control Member (Incidence and Emission of Light of Emission Element)

Now described is operation of light flux control member 5 on the basis of FIGS. 2 to 4c. In the first place, most of light within half-intensity angle (light of θ1 smaller than half-intensity angle) enters into light flux control member 5 through first recess portion 14 as shown in FIG. 2. Incidence to first recess portion 14 involves substantially no refraction in the embodiment. The other is incident to second ring-like recess portions 15a to 15d, entering into light flux control member 5.

Substantially none of such light H entering into via second ring-like recess portions 15a to 15d undergoes incidence to any of first slopes 15a1, 15b1, 15c1 and 15d1. In other words, substantially all of such light H undergoes incidence to any of second slopes 15a2, 15b2, 15c2 and 15d2.

Incidence to second slopes 15a2, 15b2, 15c2 and 15d2 hardly involves refraction because they provide surfaces generally vertical to travelling direction of light H emitted from emission element 4. As a result, generation of rays deflected as to come near to optical axis L.

Figure 20:
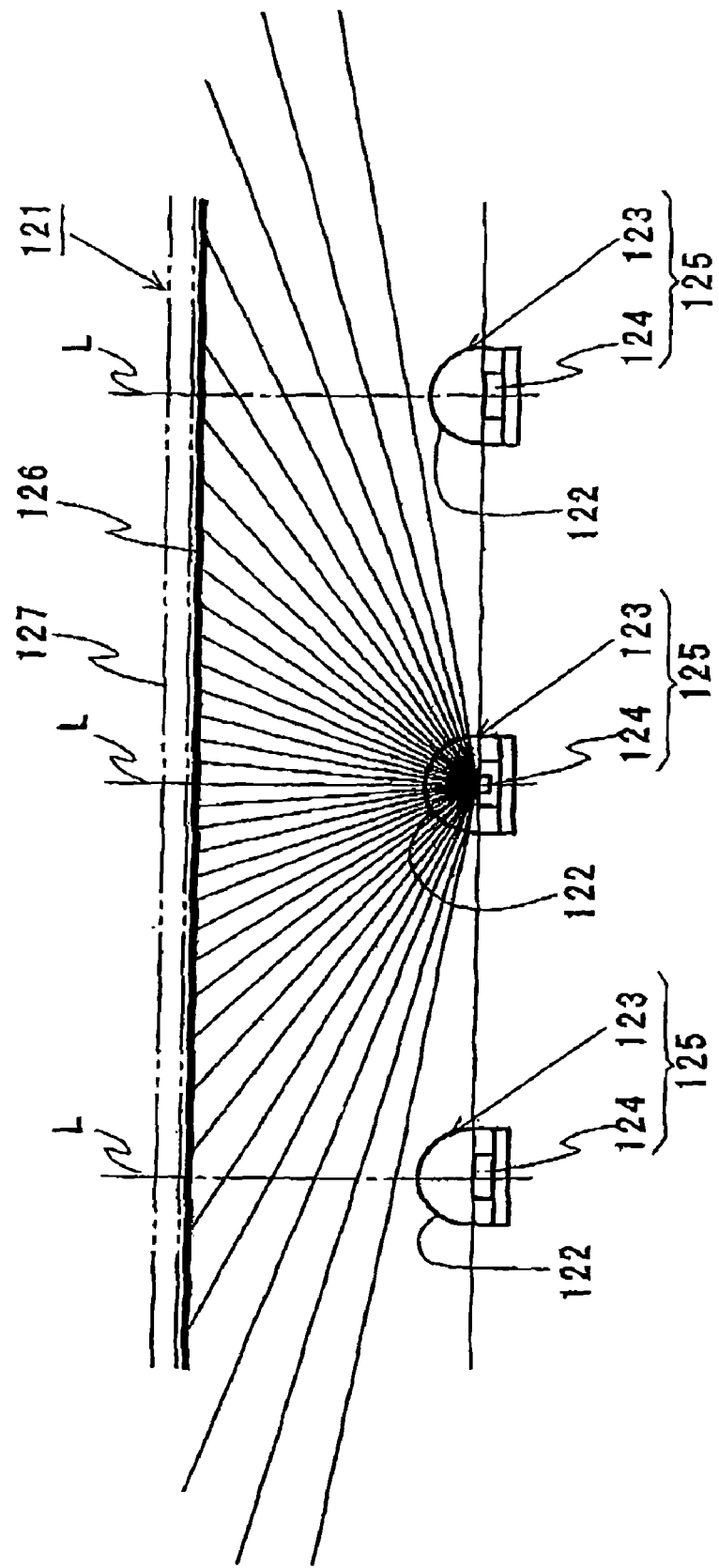
FIG. 20 is a cross section view of a display in accordance with a forth prior art.
Figure 21:
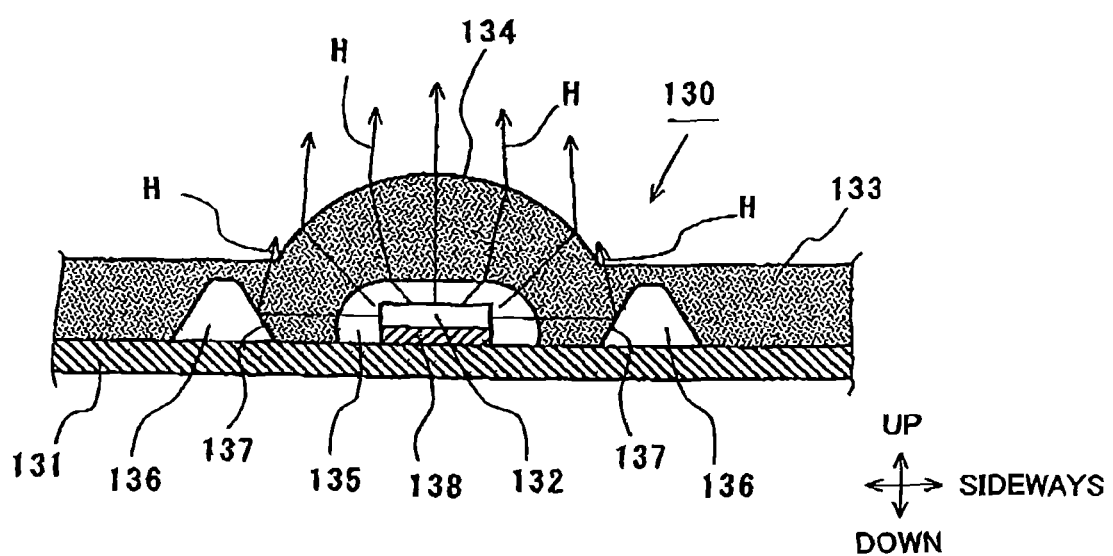
FIG. 21 is a cross section view of a conventional matrix-type display.

Next, referring to FIGS. 2 and 3, light H from emission element 4 is emitted from light control emission face 6 to the outside (air) according to Snell's Law after inner-propagation. Light emitted from light control emission face 6 is directed to smoothly expanded broad angles uniformly without locally strong emitting directions such as direction corresponding to optical axis L. Such performance is superior to that of prior art shown in FIG. 20 in which hemisphere-like light flux control member 123 is employed.

Figure 8:
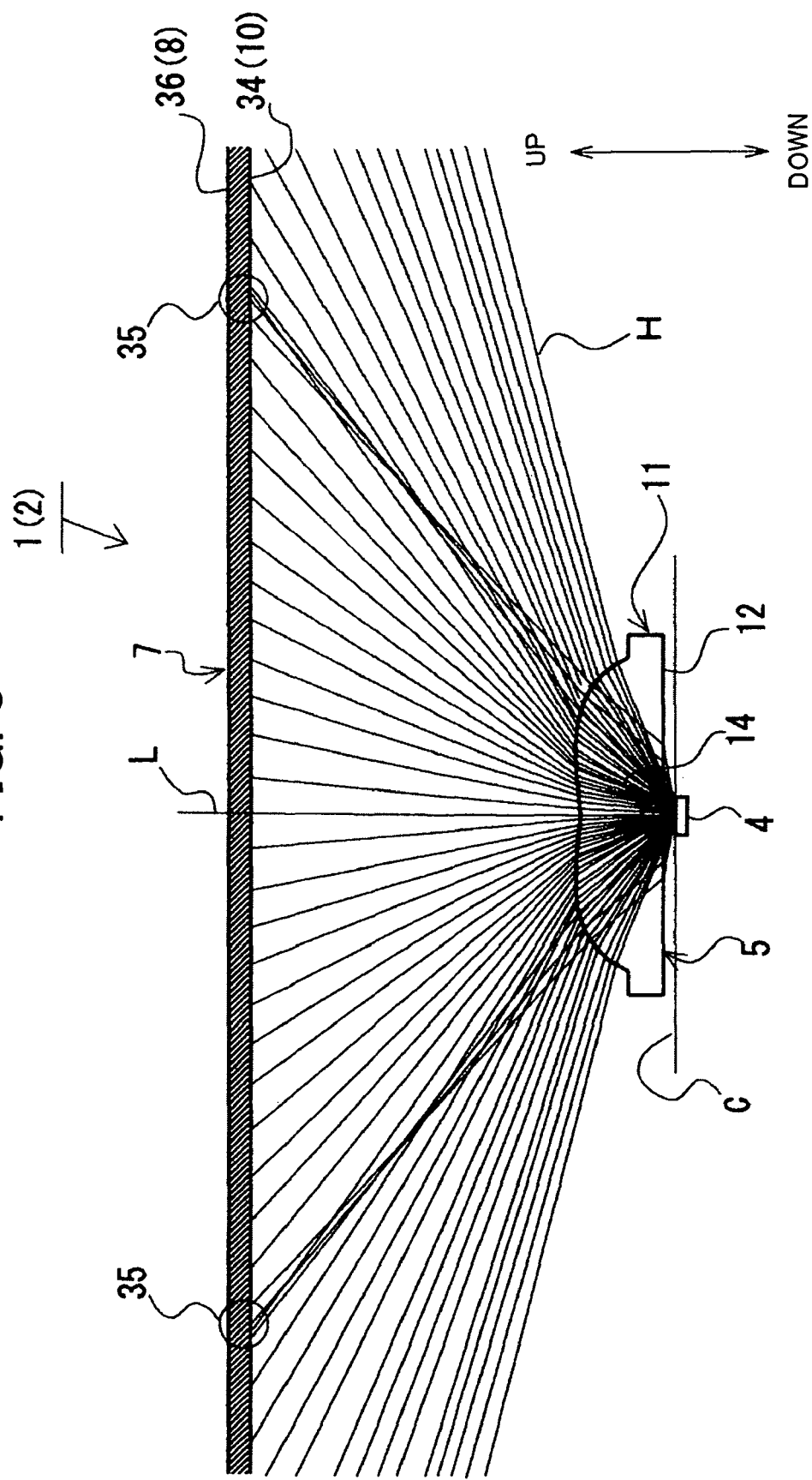
FIG. 8 gives a diagramic illustration showing a trouble generation state which would be brought under a condition such that no ring-like-recess is formed on a back face of light flux control member.

Provided that back face 12 of light flux control member 5 lacks second recess portions 15 shown in FIG. 4, namely, flat back face 12 parallel to reference plane C is formed as shown in FIGS. 8, light H from emission element is refracted as to come near to optical axis L. This would brings a result such that light h undergoing incidence to first recess portion 14 and other light H undergoing incidence to the other part (other than first recess portion 14) of back face 12 gather on surface-to-be-illuminated 34 of light diffusion member m 7 after being emitted from light flux control member 5. Such phenomenon occurs, in other words, when light flux control member 5 shown in FIG. 8 is employed.

Such light gathering part 35 provide a ring-like locally bright part brighter than the other part. Such ring-like bright part is seen from above emission face 36 of light diffusion member 7, resulting in a reduced illumination quality. Light flux control member 5 of the embodiment in accordance with the present invention can avoid such a ring-like locally bright portion from appearing because second recess portions 15 function as to restrains refraction on entering into light flux control member 5 from producing rays which bring ring-like locally bright part.

(Light Diffusion Member)

Referring to FIGS. 2 and 3, light diffusion member 7 is a sheet-like or flat plate-like optical element capable of transmitting and diffusing light. Base material of light flux control member 7 is, for example, light permeable resin such as PMMA (polymethyl methacrylate) or PC '(polycarbonate). Light diffusion member 7 has a plan size generally the same as that of object-to-be-illuminated such as LCD-panel, advertising panel or other display panels. Light diffusion member 7 is provided with light diffusion ability given to at least inside or surface. For example, light diffusion member 7 has a surface provided with micro-unevenness such as prismatic projections, emboss-processed surface, bead-coating surface. Micro-particles may be dispersed in light diffusion member 7 so that inside scattering ability is given.

Light diffusion member 7 may be mounted on an inner side of object-to-be-illuminated 3 or, alternatively, may be disposed as to separated from object-to-be-illuminated 3 between object-to-be-illuminated 3 and light flux control member 5.

(Concrete Example of Emission Device and Surface Light Source Device)

Now described is an concrete example of emission device 1 using light flux control member 5 and surface light source device including emission device 1 by referring to FIGS. 1 to 4c.

For light control emission face 6 of light flux control member 5 shown in FIGS. 1 to 4c, size, configuration and others of first and second emission faces 6a, 6b may be determined under consideration of various factors as follows.

Emission characteristics of emission element; In particular, expansion angle of light emitted from emission element 4. This can be expressed, for example, by half-intensity angle defined previously.

Thickness d1 of light flux control member 5 along optical axis L; In particular, distance from emitting point 13 (emitting surface 20) of emission element 4 to the top location of light control emission face 6 along optical axis L.

Arrangement pitch (interval) p of emission elements 4

Outer diameter Do of light flux control member 5

Distance L1 from light control emission face 6 to light diffusion member m 7 along optical axis L.

Refractive index n of light flux control member 5

Configuration of recess portion 14 of light flux control member 5

An example of data set of light flux control member 5 is as follows.

Refractive index n=1.49 (transparent resin material)

Configuration of recess portion 14 is like a hemisphere, with ri-1.5 mm, L1=15.41 mm, p=46 mm, d=4.59 mm, d1=4.09 mm, ε=0.5 mm, and Do=14.65 mm Under such data, light flux control member 5 is formed as to give θ1=δ2=14° at the connection portion between first emission face 6a and second emission face 6b, and as to give θ1=δ1=75°. the connection portion between second emission face 6b and third emission face 6c.

Third emission face 6c is formed as to have a configuration that is obtained by rotating tangential line at the outermost of second emission face 6b around optical axis L by 360 degrees. In FIG. 4c, a range of θ1≦δ2 gives (corresponds to) a range of first emission face 6a. On the other hand, a range of δ2≦θ1≦δ1 gives (corresponds to) a range of second emission face 6b. Further, a range of δ1≦θ1 gives (corresponds to) a range of third emission face 6c.

As shown in FIGS. 4a to 4c, ring-like recesses 15 of light flux control member 5 composed of first to forth ring-like recesses 15a to 15d, being expressed by the following data.

w=0.2 mm

L2-5.79 mm

Angle of straight line 25 (first slope 15a1) of first ring-like recess portion 15a with respect to reference plane C; 19.5°

Angle of straight line 30 (first slope 15c1) of third ring-like recess portion 15c with respect to reference plane C; 9.7°

Angle of straight line 32 (first slope 15*d*1) of forth ring-like recess portion 15*d* with respect to reference plane C; 6.9°

In addition, first to forth ring-like recess portions 15*a* to 15*d* are have second slopes 15*a*2 to 15*d*2 which are generally vertical to first slopes 15*a*1 to 15*d*1, respectively.

The reason why ring-like recesses terminate at forth ring-like recess portion 15*d* is based on results obtained by simulation described below.

The simulation was performed for studying a preferable range in which ring-like recess portions are formed to prevent ring-like locally bright part from appearing due to incidence to back face 12 of light flux control member 5.

First prepared was a surface light source device including an emission device which are the same as surface light source device 2 and emission device 1 in accordance with embodiment except that no ring-like recess portion 15 is formed on a back face. For the sake of description, thus prepared light flux control member 5 having no ring-like recess portion 15 on the back face thereof is called "dummy light flux control member 5".

Back face 12 of this dummy light flux control member 5 was covered partially by ring-like light shielding (shading) plate member 37.

Several kinds of light shielding (shading) plates were prepared member 37. They had different areas of openings 38 from each other. Different areas of openings 38 correspond to different ranges of incident angle θ). Back face 12 of this dummy light flux control member 5 was covered partially by different ones of the prepared ring-like light shielding (shading) plate members 37 one after another.

For each case of covering by each of the ring-like light shielding (shading) plate members 37, illuminance of ring-like locally bright part on surface-to-be-illuminated 34 of light diffusion member 7 was calculated (estimation based on calculation). Results are shown in FIG. 10.

Figure 9:
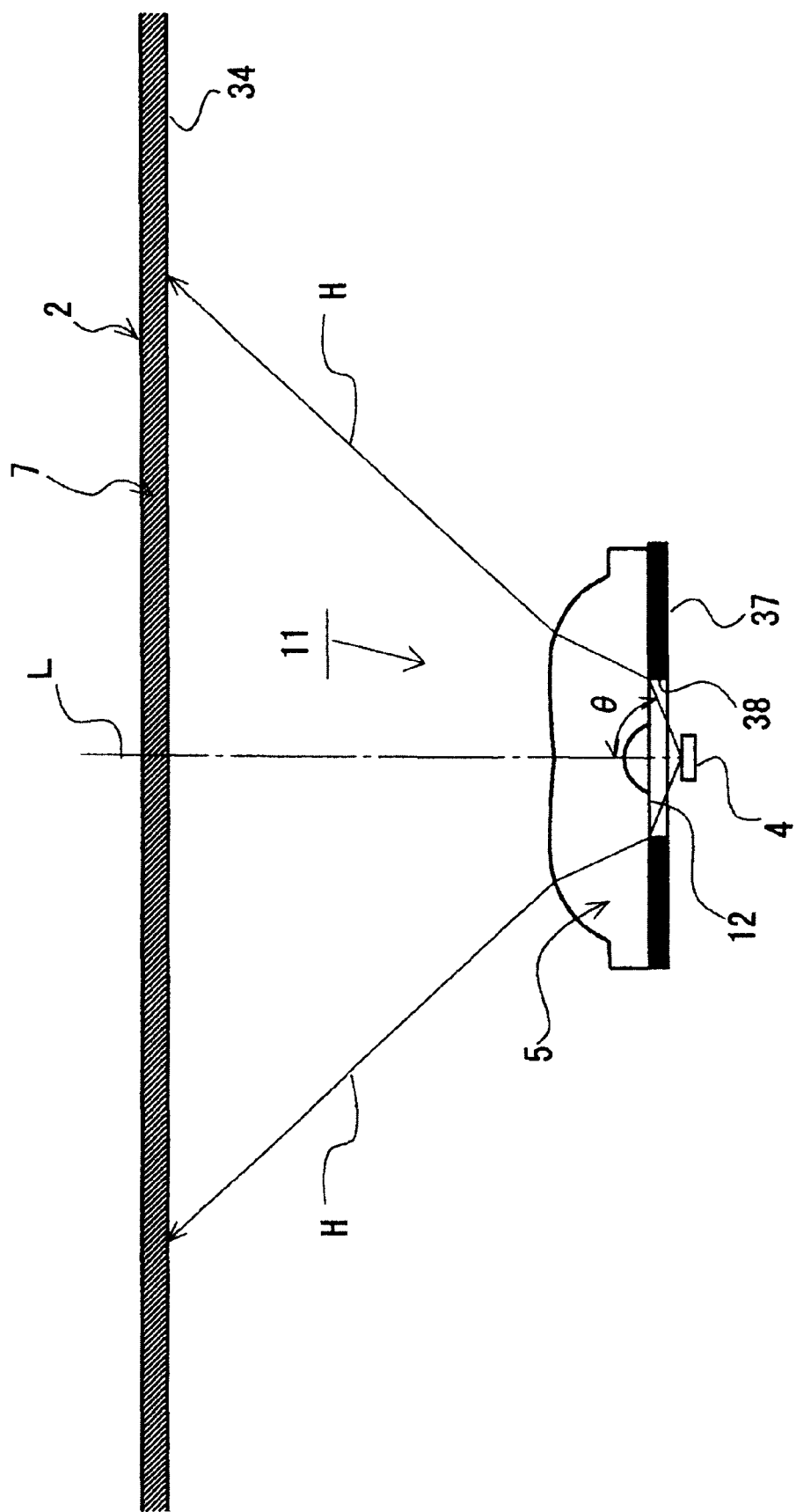
FIG. 9 is a diagram illustrating illuminance measurement simulation of ring-like bright part.
Figure 10:
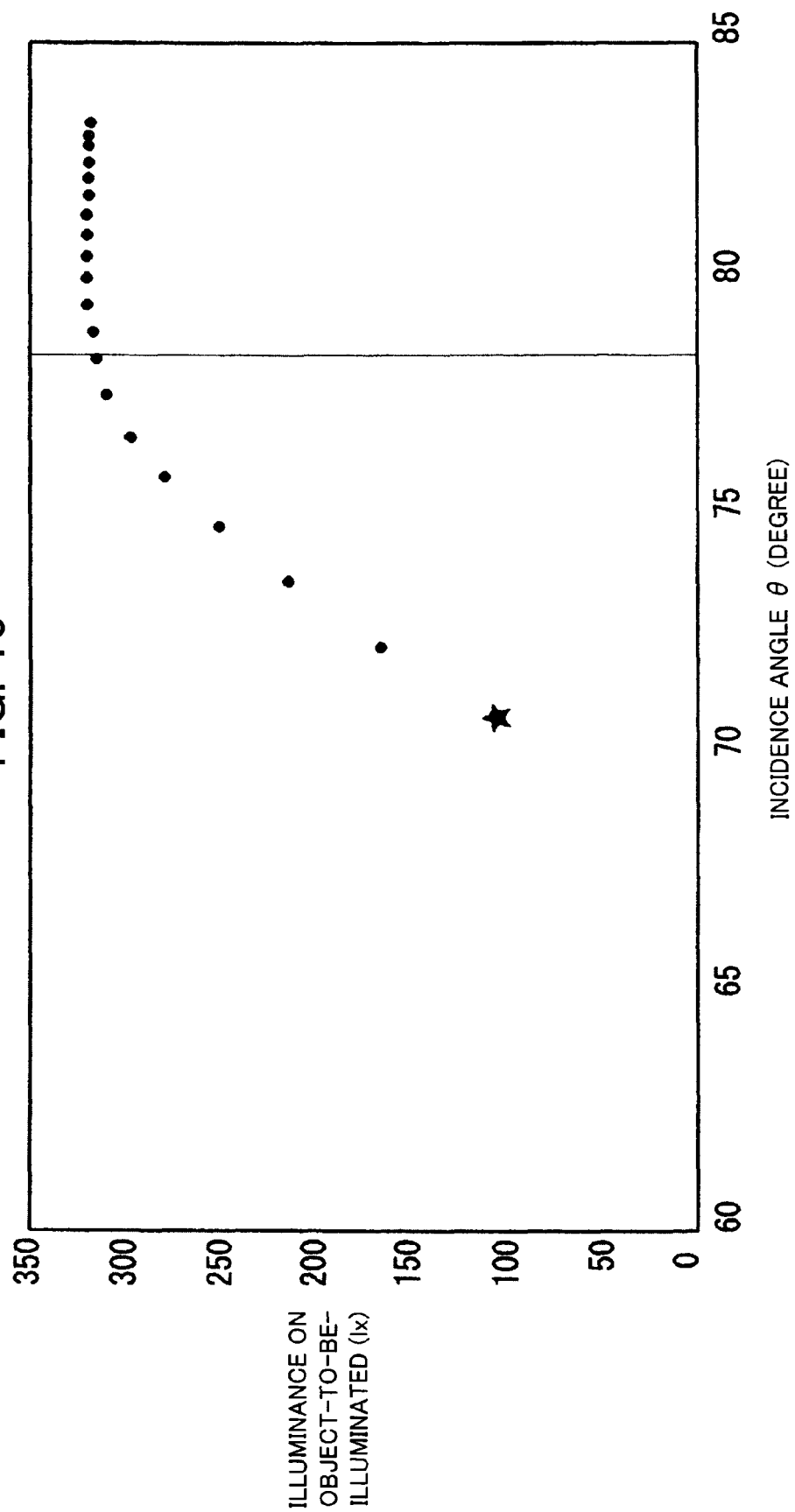
FIG. 10 is a graphic diagram illustrating a result of the simulation shown in FIG. 9, wherein abscissas gives distance from reference optical axis and ordinate gives illuminance of ring-like bright part.

As shown in FIG. 10, the larger area of opening 38 is the larger is illuminance of ring-like locally bright part until incidence angle θ1 in FIG. 9 reaches about 78 degrees. However, if incidence angle θ1 exceeds about 78 degrees, illuminance converges to a generally constant value gradually.

This tells that light incident to back face 12 with incidence angle θ larger than 78 degrees hardly influences ring-like locally bright part. Therefore covering range of ring-like recess portions 15 can be regarded as being enough so far as light with θ smaller than 78 degrees is taken into consideration. Light with θ smaller than 78 degrees can effect as to increase illuminance of ring-like locally bright part.

It is noted that light is refracted as to come nearer to optical axis L under employment of dummy light flux control member 5 as shown in FIG. 8 and accordingly, ring-like locally bright part 35 appears as to surround optical axis L on surface-to-be-illuminated 34 of light diffusion member 7. Such ring-like locally bright part 35 reduces illumination quality.

As previously described, light flux control member 5 in accordance with the embodiment (concrete example) prevent light incident to a part other than recess portion 14 from being refracted as to come nearer to optical axis 1. As a result, any ring-like locally bright part hardly appear on surface-to-be-illuminated 34 of light diffusion member 7, being free from reduction in illumination quality.

(Emission Quantity from Light Diffusion Member)

Figure 11:
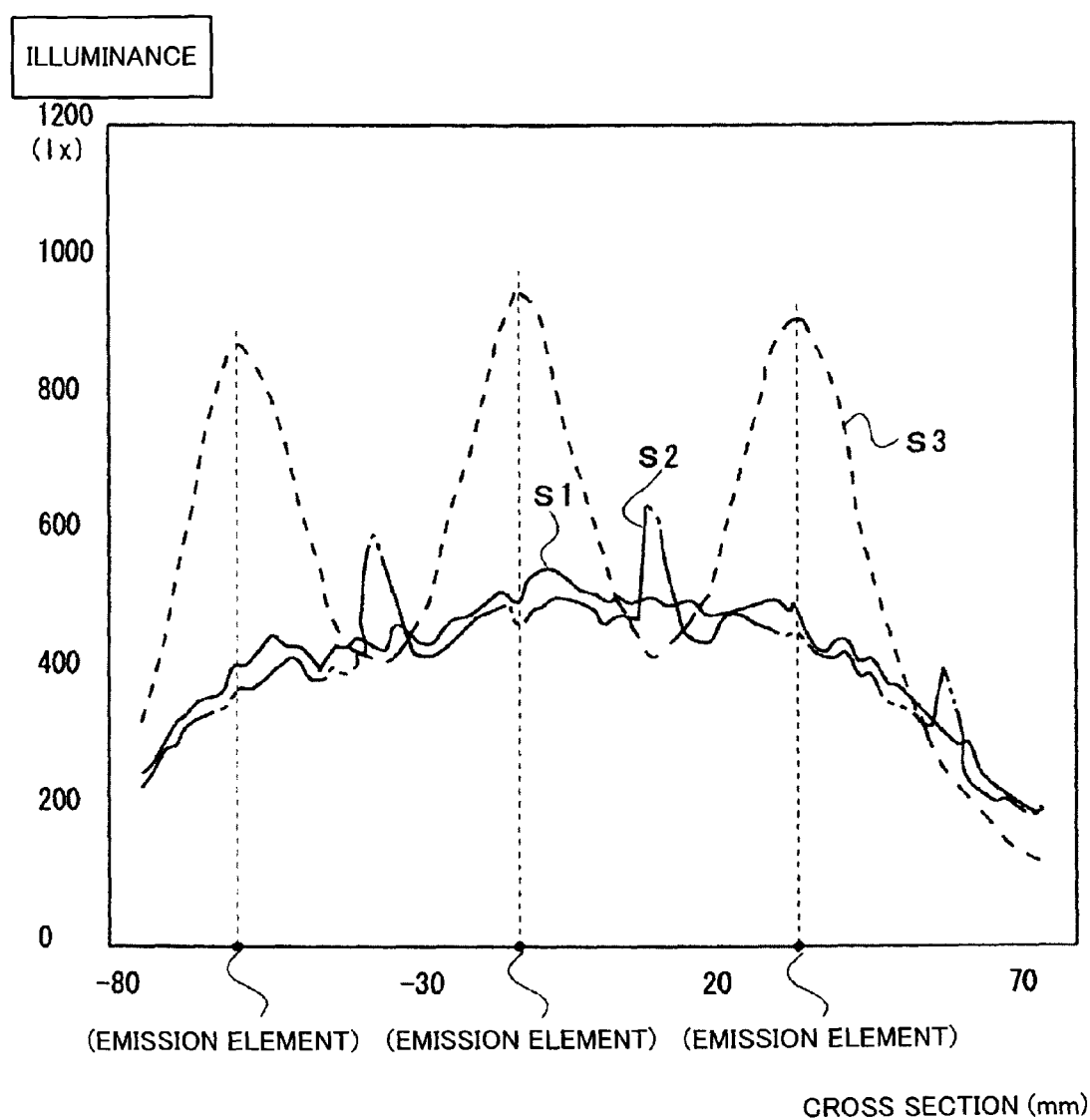
FIG. 11 is a graphic diagram illustrating an emission quantity distribution of light supplied to an object-to-be-illuminated of a display employing an emission device in accordance with the present invention together with an reference example for comparison.

FIG. 11 is a graphic diagram illustrating an emission quantity distribution of light supplied to object-to-be-illuminated 3 of display 1. Shown in FIG. 11 is an emission quantity distribution of emission at locations along line X3-X3 in FIG. 1 on emission face 8 of light diffusion member 7 (See FIG. 2).

In FIG. 11. ordinate gives illuminance (1x) and abscissa gives distance from a center of surface light source device 2 shown in FIG. 2 along line X3-X3.

Referring to FIG. 11, line S1 gives an illuminance distribution of surface light source device 2 employing emission device 1 in accordance with the embodiment. On the other hand, line S2 gives an illuminance distribution of surface light source device 2 employing emission device 1 shown in FIG. 8. In addition, line S3 gives an illuminance distribution of surface light source device 2 employing no light flux control member. In other words, line S3 corresponds to a case of direct irradiation from emission element 4 to light diffusion member 7 is applied.

As shown in FIG. 11, line S3 gives an extremely high illuminance just above emission element 4 and a relatively low illuminance at sections corresponding to absence of emission element 4. In other words, illuminance varies largely, failing to provide uniform illumination.

Line S2 gives an improved illuminance distribution as compared with S2. In other words, uniformalized illumination to an extent is achieved. However, in case of line S2, some rays (light H) are refracted as to come near to optical axis L on incidence to back face 12 of light flux control member 5. These rays cross over with other rays coming from recess portion 14. This brings ring-like locally bright part 35 at a center of section corresponding to absence of emission element 4. Such ring-like locally bright part 35 is viewed through light diffusion member m 7, being harmful.

To the contrary, line S1 gives an illuminance distribution such that no ring-like locally bright part 35 appears. This brings a very uniform illumination.

(Summary of Effects of the Embodiment)

According to the embodiment, a greater part of the light emitted from emission element 4 enters into light flux control member 5 via recess portion 14, being emitted from light control emission face 6. The other part of the light emitted from emission element 4 enters into light flux control member 5 via ring-like recess portions 15 (15*a* to 15*d*), becoming inner-propagation light which is not deflected as to come nearer to optical axis L by refraction on incidence to ring-like recess portions 15. As a result, light H via ring-like recess portions 15 is not emitted from light control emission face 6, or, if some emission involved, it occurs in the vicinity of the outermost periphery of light control emission face 6. This prevents ring-like locally bright part from appearing, with the result that illumination light is kept high. Emission from light control emission face 6 is broadly and smoothly diverged, providing a uniform illumination.

If a plurality of emission elements 4 are arranged at intervals as primary light source, light fluxes from respective emission elements 4 are mixed mutually with ease. Accordingly, if unevenness in emission color exists among emission elements 4, light emitted from light flux control member 5 hardly shows unevenness in illumination color.

In addition, since back face 12 of light flux control member 5 is distant from emission element 4 by a predetermined distance ϵ as to enable heat generated by emission element 4 to be radiated well, bad influence by heat is avoided.

(First Modification)

Figure 12A:
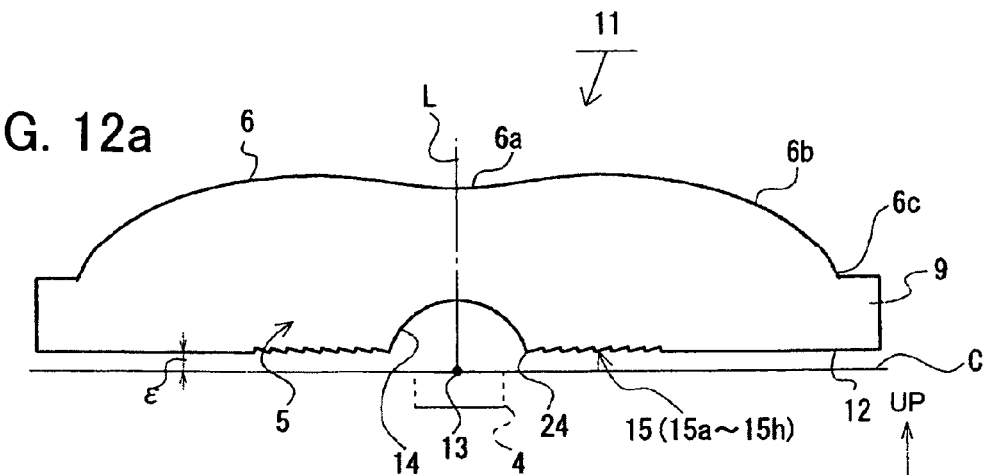
FIGS. 12a and 12b illustrate details of a light flux control member employed in a first modification in accordance with the present invention, FIG. 12a being an illustration corresponding to FIG. 4b and FIG. 12b being a partially enlarged illustration of a part of back side of the same light flux control member (a part of FIG. 12a)
Figure 12B:
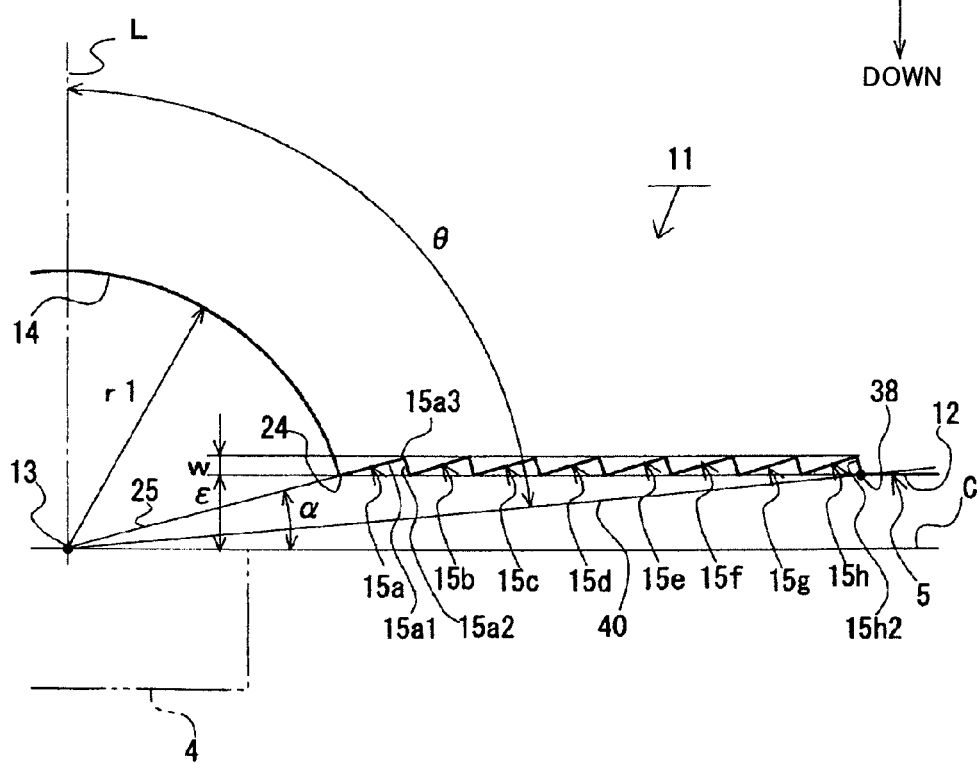
Figure 13:
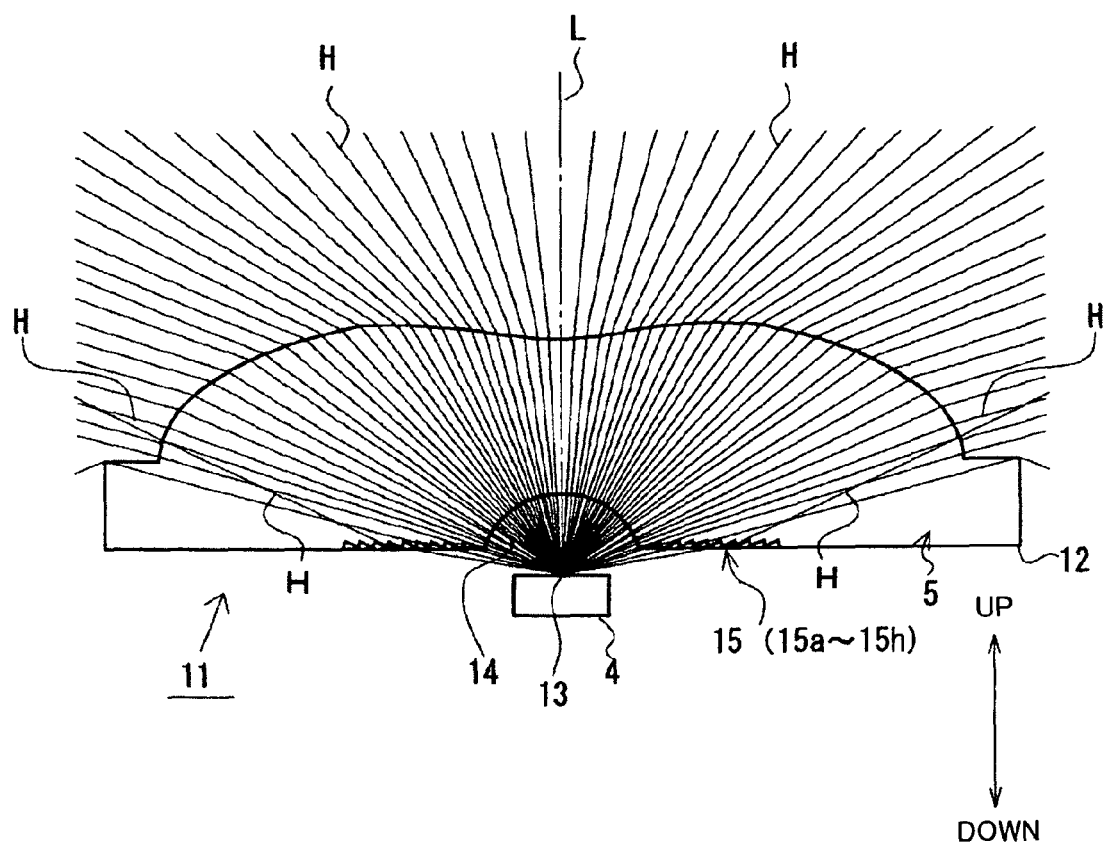
FIG. 13 is a diagram illustrating operation (state of emission from an emission element) of the light flux control member of the first modification in accordance with the present invention.

FIGS. 12*a*, 12*b* and 13 illustrate light flux control member 5 employed in a first modification of the present invention. It is noted that light flux control members 5 employed in the first modification and in second to third modifications described later are structured in the same way as light flux control member 5 employed in the embodiment already described except for recess portion(s) 15. Therefore common reference numerals are used for common elements and repeated description is omitted.

Referring to FIGS. 12a and 12b, light flux control member 5 has back face 12 provided with recess portions 15 consisting of first to eighth recess portions 15a to 15h. Respective recess portions 15a to 15h have the same cross section configuration. That is, first ring-like-recess-portion 15a has a triangle-like cross section, including first slope 15a1 generally located on an extended part of straight line 25 running from emitting point 13 to opening edge 24 of recess portion 14. End portion 15a3 of first slope 15a1 is located at depth of w=0.1 mm from back face 12. Ring like second slope 15a2 connects end portion 15a3 with a side of back face 12, being generally vertical to first slope 15a1. second to eighth ring-like recess portions 15b to 15h are formed as to be structured in the same way.

Examples of factors are as follows.
Radius r1 of recess portion 14; 1.5 mm
Gap ϵ; 0.5 mm
Angle α of line 25 with respect to reference plane C; 19.5°
Angle θ of line 40 running through emitting point 13 and back face side end edge 38 of second slope 15h2 of eighth ring-like 1 recess portion 15h with respect to optical axis L; 78° or more Such light flux control member 5 gives a functional feature to emission device 1 employing the same as follows.

As shown in FIG. 13, incident light H of a large incidence angle (about half-intensity angle) to light flux control member 5 is slightly deflected by refraction as to come near to optical axis 1, then being emitted from light flux control member to be supplied to light diffusion member 7. This will bring crossing over with light H coming from recess portion 14, producing a ring-like locally bright part on surface-to-be-illuminated 34 of light diffusion member 7.

However, the above ring-like locally bright part has a very large size and the above deflected light has a weak intensity (brightness). Therefore such a large and weak ring-like locally bright part is not conspicuous, being hardly harmful.

If a plurality of emission elements 4 are arranged, fluxes from respective emission elements 4 are mixed mutually and the above ring-like locally bright part is more free from being conspicuous (See FIGS. 1 and 2). After all, with emission device 1, surface light source device and display in accordance with the first modification, recess portions 15 can prevent ring-like locally bright parts from appearing. The first modification can has similar advantages as compared with the embodiment previously described.

(Second Modification)

Figure 14A:
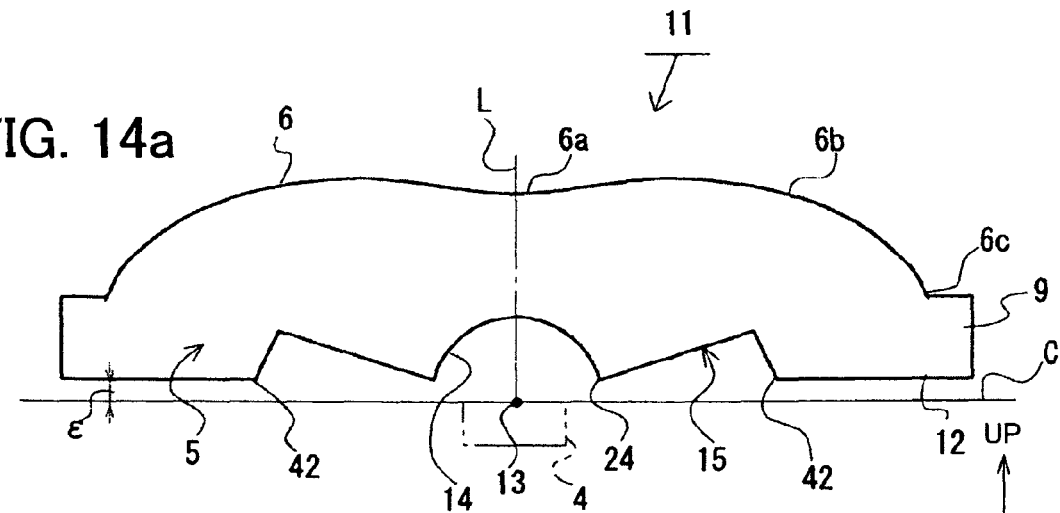
FIGS. 14a and 14b illustrate details of a light flux control member employed in a second modification in accordance with the present invention, FIG. 14a being an illustration corresponding to FIG. 4b and FIG. 14b being a partially enlarged illustration of a part of back side of the same light flux control member (a part of FIG. 14a)
Figure 14B:
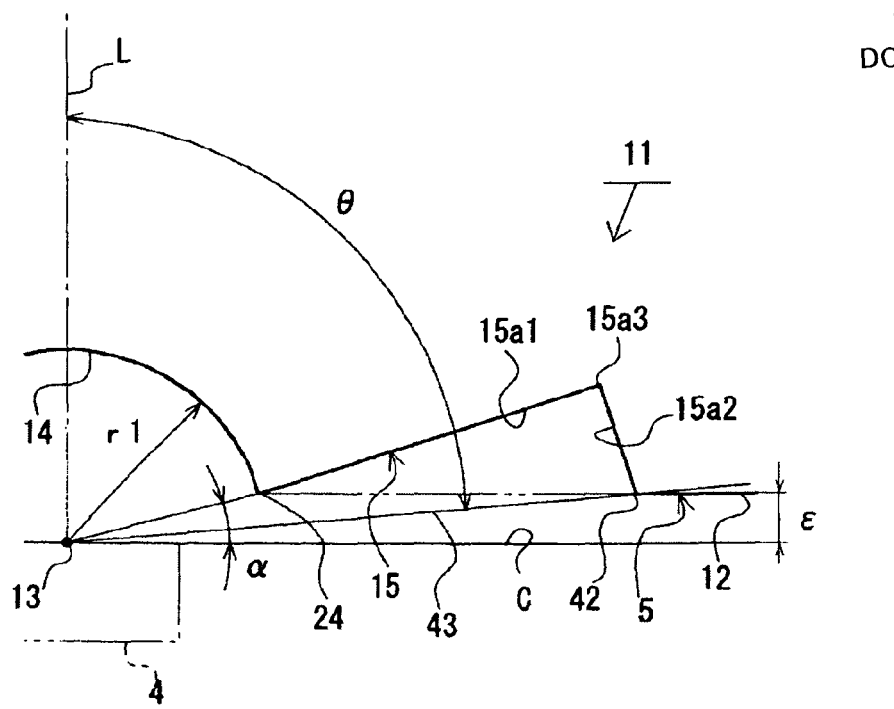
Figure 15:
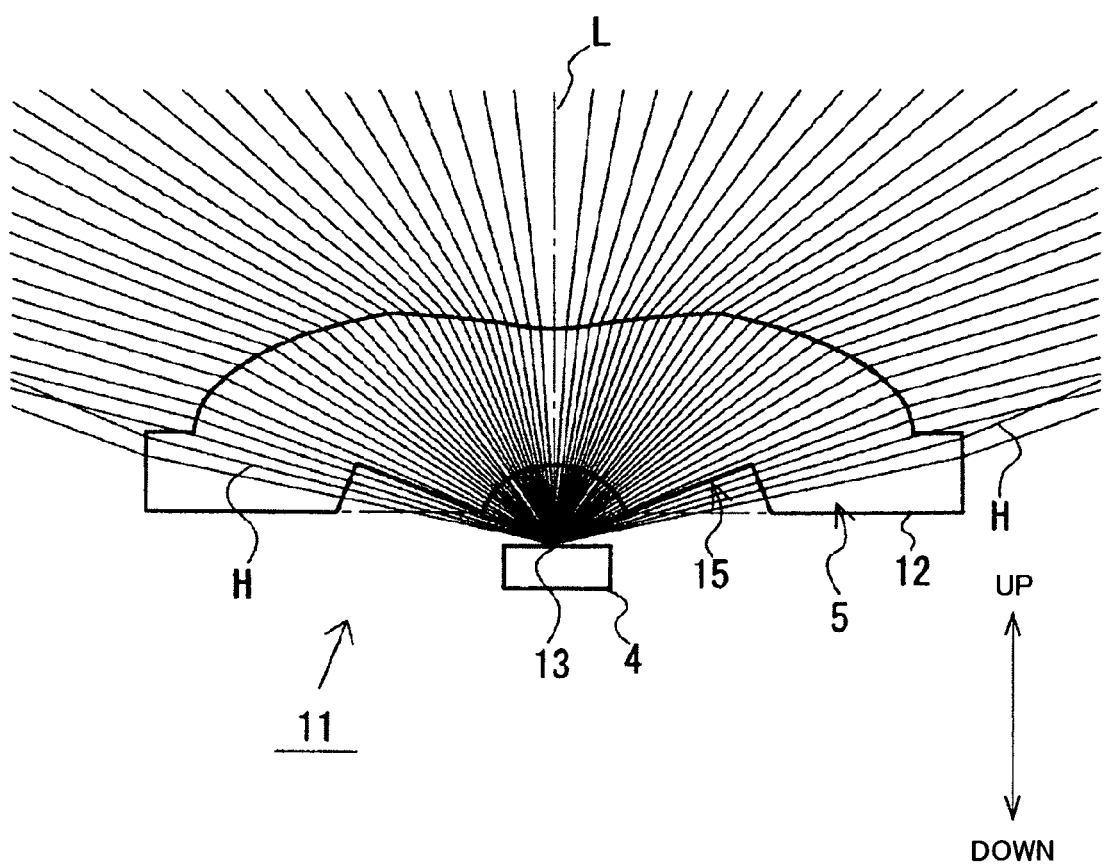
FIG. 15 is a diagram illustrating operation (state of emission from an emission element) of the light flux control member of the second modification in accordance with the present invention.

FIGS. 14a, 14b and 15 illustrate light flux control member 5 employed in a second modification of the present invention.

Referring to FIGS. 14a and 14b, light flux control member 5 has back face 12 provided with a single ring-like recess portion 15. Ring-like recess portion 15 has a triangle-like cross section, provided with ring-like first slope 15a1 and ring-like second slope 15a2.

First slope 15a1 is generally located on an extended part of straight line 25 running from emitting point 13 to opening edge 24 or recess portion 14. Ring like second slope 15a2 connects end portion 15a3 with a side of back face 12, being generally vertical to first slope 15a1.

Examples of factors are as follows.
Radius r1 of recess portion 14; 1.5 mm
Gap ϵ; 0.5 mm
Angle α of line 25 with respect to reference plane C; 19.5°
Angle θ of line 43 running through emitting point 13 and back face side end edge 42 of second slope 15a2 of ring-like 1 recess portion 15 with respect to optical axis L; 78° or more Ring-like recess portion 15 has a configuration corresponding to a configuration obtained by enlarging first ring-like recess portion 15a of light flux control member 5 employed in the first modification. In other words, the second modification is obtained by substitute first to eighth ring-like recess portions 15a to 15h in the first modification with one ring-like recess portion 15.

As shown in FIG. 15, incident light H of a large incidence angle (about half-intensity angle) to light flux control member 5 is slightly deflected by refraction as to come near to optical axis 1, then being emitted from light flux control member to be supplied to light diffusion member 7. This will bring crossing over with light H coming from recess portion 14, producing a ring-like locally bright part on surface-to-be-illuminated 34 of light diffusion member 7.

However, the above ring-like locally bright part has a very large size and the above deflected light has a weak intensity (brightness). As discussed in the first modification, such a large and weak ring-like locally bright part is not conspicuous, being hardly harmful.

If a plurality of emission elements 4 are arranged, fluxes from respective emission elements 4 are mixed mutually and the above ring-like locally bright part is more free from being conspicuous (See FIGS. 1 and 2). After all, with emission device 1, surface light source device and display in accordance with the second modification, recess portions 15 can prevent ring-like locally bright parts from appearing. The second modification can has similar advantages as compared with the embodiment previously described.

(Third Modification)

Figure 16:
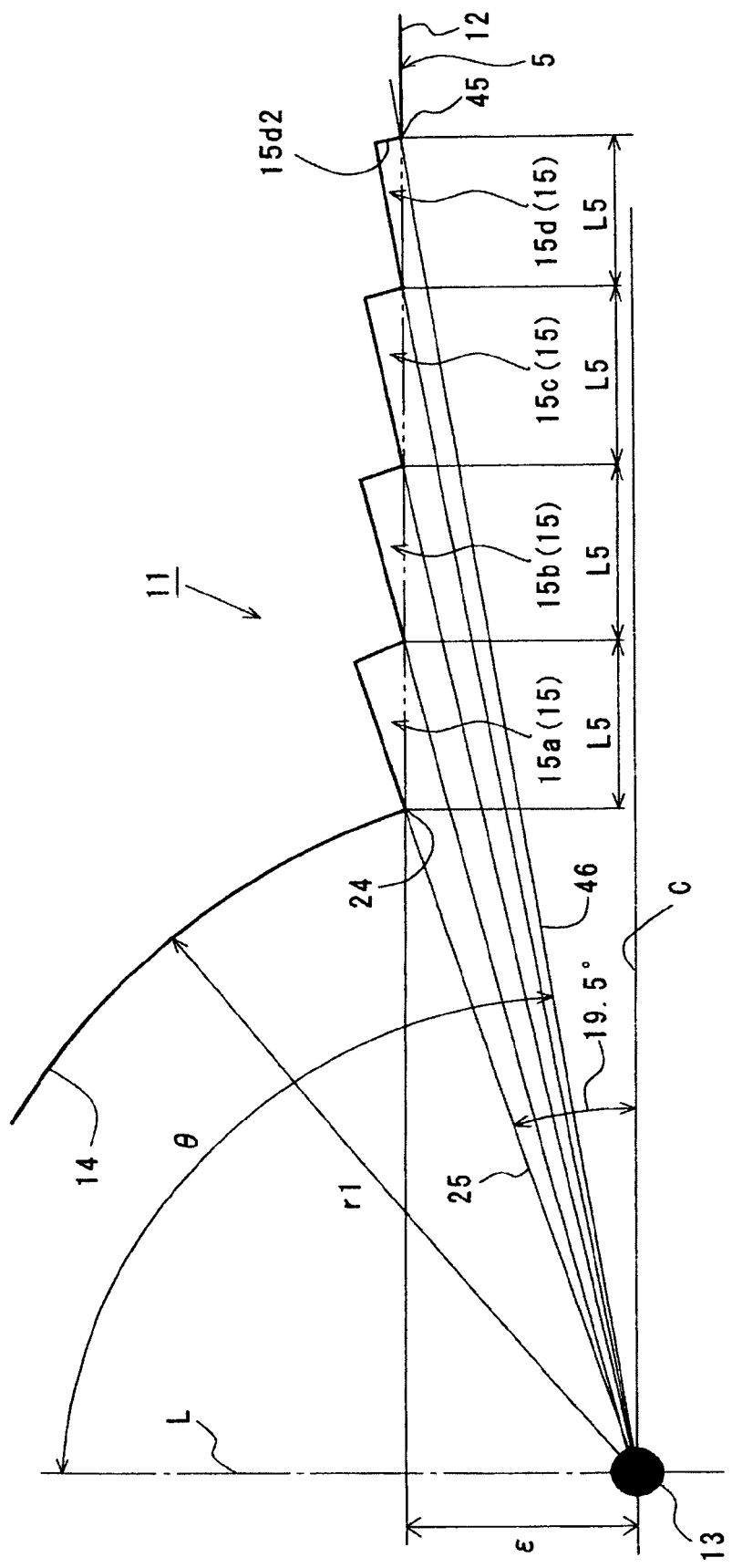
FIG. 16 is a partially enlarged cross section view of a part of back side of the same light flux control member employed in the third modification in accordance with the present invention.
Figure 17:
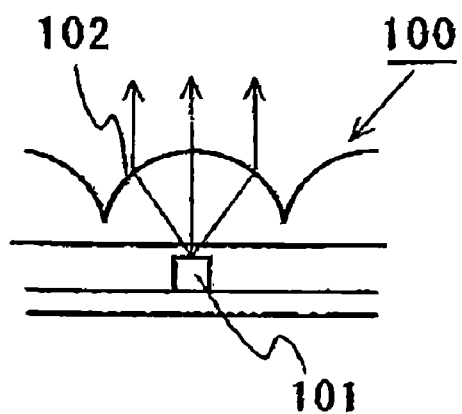
FIG. 17 is a diagram illustrating structure in accordance with a first prior art.
Figure 18:
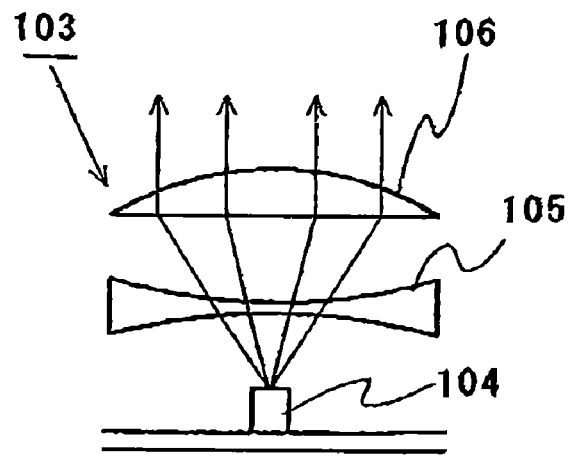
FIG. 18 is a diagram illustrating structure in accordance with a second prior art.
Figure 19:
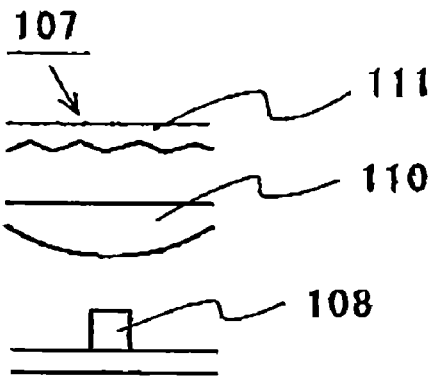
FIG. 19 is a diagram illustrating structure in accordance with a third prior art.

FIG. 16 illustrates light flux control member 5 employed in a third modification.

Referring to FIG. 16, light flux control member 5 has back face 12 provided with a plurality of ring-like recess portions 15a to 15d which are arranged in order successively toward outside at a constant pitch L5 from recess portion 14.

Ring-like recess portion 15d has second slope 15d2, being formed so that back face side end edge 45 of second slope 15d2 is located at generally the same position as the position of back face side end edge 33 of second slope 15d2 of forth ring-like recess portion 15d in the embodiment described above. In the third modification, the outermost ring-like recess portion is ring-like recess portion 15d.

Examples of factors are as follows.
Radius r1 of recess portion 14; 1.5 mm
Gap ϵ; 0.5 mm
Angle α of line 25 with respect to reference plane C; 19.5°
Angle θ of line 46 running through emitting point 13 and back face side end edge 45 of second slope 15d2 of ring-like 1 recess portion 15d with respect to optical axis L; 78° or more With emission device 1, surface light source device and display in accordance with the third modification, ring-like recess portions 15 can prevent ring-like locally bright parts from appearing because refraction on incidence to ring-like recess portions 15 hardly involve generation of rays deflected as ro come near to optical axis L. Thus the third modification can has similar advantages as compared with the embodiment previously described.

(Other Modifications)

The above-described embodiment and modifications does not limit the scope of the present invention. For example, the following modifications are allowed.

(a) Light control emission face 6 may be an micro-unevenness surface or matted surface to diffuse light on emitting.

(b) Light flux control member 5 may be formed of a material containing light diffusing fine particles such as silicone particles or titan oxide particles.

(c) Light flux control members 5 employed in the embodiment and modifications described above have triangle-like cross sections and first slopes 15a1 generally vertical to second slopes 15a2. In addition, inclination angles of second slopes 15a2 are greater than inclination angles of first slopes 15a2 with respect to a general plane of back face 12. However, such matters do not limit the present invention.

For example, several independent recess portions may be formed instead of second recess portions 15 in the embodiment. Such independent recesses may be cone-like recess portions or hemi-sphere-like recess portions. Alternatively, the above described ring-like recess portions 15 may be substituted by recess portions each of which has a shape obtained by cutting away some small parts of a ring corresponding to each of the above described ring-like recess portions 15. In other words, quasi-ring-like recess portions may be employed.

(d) Second ring-like recess portions 15 formed on back face 12 of light flux control member 5 may be modified as shown in FIGS. 22a to 22f.

FIG. 22a is a back face plan view of light flux control member 5 and FIG. 22b is a partially enlarged illustration of a part of back face 12 around recess portion 14 of light flux control member 5.

FIG. 22c illustrates a cross section along x4-x4 in FIG. 22b, showing a cross section configuration of hemi-sphere-like recess portion 51. FIG. 22d is a perspective of a hemi-sphere-like recess portion providing a second recess portion. FIG. 22e illustrates a cross sections along x4-x4 in FIG. 22b, showing a cross section configuration of cone-like recess portion 52. FIG. 22f is a perspective view of cone-like recess portion 52 used for second recess portion.

As shown in FIGS. 22a to 22f, second recess portion is composed of a plurality of independent recess portions. Each of such independent recess portions may have a hemi-sphere-like configuration (hemi-sphere-like recess portion 51 shown in FIGS. 22c, 22d) or have a cone-like configuration (cone-like recess portion 52 shown in FIGS. 22e, 22f). It can be said that hemi-sphere-like configuration is obtained by cutting away a part of sphere. The above cone-like configuration has an isosceles-like cross section.

(e) Each second recess portion is allowed to have a cross section shape chosen of various shapes such as isosceles-like and arc-like. However, it is preferable that each of second recess portions is small enough to avoid a conspicuous ring-like locally bright part from being seen through light diffusion member 7.

Such a conspicuous ring-like locally bright part can be generated by light coming from recess portion 14 enters into first slope 15a1 before reaching light control emission face 6 due to total reflection. However, if second recess portion is small enough, only slight inner-incidence to first slope 15a1 occurs, resulting in being free from conspicuous ring-like locally bright part appearance.

The invention claimed is:

1. An emission device comprising:
at least one point-like-light-source; and
a light flux control member having a back face to which an output light flux of said point-like-light-source is incident before undergoing propagation within said light flux control member and an emission face which is opposite to said back face and outputs illumination light forming a three-dimensional emission flux in a traveling direction and a center of which is defined as a reference optical axis, wherein said emission face includes a light control emission face controlling the emission of said illumination light, and said back face includes a first recess portion which is formed at a location corresponding to said point-like-light-source as to be capable of introducing a part of said light fluxes of said point-like-light-source into said light flux control member and at least one second recess portion which is located in an area surrounding an opening-edge of said first recess portion as to be capable of introducing another part of said light fluxes of said point-like-light-source into said light flux control member, said second recess portion being configured as to be capable of restraining refraction on incidence of light of said point-like-light-source to said second recess portion from generating inner-propagation light having a traveling direction approaching said reference optical axis, said light control emission face being configured as to meets the following conditions (a), (b) and (c) regarding light emitted in a direction range which is at least within 75° from a maximum intensity light emission direction of said point-like-light-source, so far as out of a neighbor of said reference optical axis, under a definition such that θ1 is angle of inner-propagation direction after incidence to said light flux control member with respect to a direction parallel with said reference optical axis and emission angle θ5 is angle of emission from said light control emission face with respect to a direction parallel with said reference optical axis, (a) {θ5 /θ1 }>1 is satisfied;
(b) θ5 gets larger with increasing of θ1, and
(c) increasing quantity of θ5 relative to increasing quantity of θ1 gets smaller as θ1 gets larger, and said second recess portion having a triangle-like cross section shape on a plane on which said reference optical axis extends, and having a ring-like first slope adjacent to said first recess portion and a ring-like second slope which is located outside of said ring-like first slope and connects an end portion of said first slope with said back face, said first slope being formed as to either extend on an extended part of the straight line running between an emission center of said point-like-light-source and other end portion of said first slope, or be formed at an inclination angle larger than an inclination angle of said extended part of the straight line with respect to a general plane of said back face so that light which has reached said second recess portion after being emitted from said point-like-light-source is not hindered from being incident to said second slope.

2. An emission device in accordance with claim 1, wherein said second recess portion is a ring-like recess portion surrounding said first recess portion.

3. An emission device in accordance with claim 2, wherein said at least one second recess portion consists of a set of second recess portions,
said set of second recess portions being arranged concentrically and successively as to surround said first recess portion, and
all of said set of second recess portions, except for one second recess portion that is located adjacent to said opening-edge of said first recess portion, being configured as to be same as or similar to said one most inner side second recess portion.

4. An emission device in accordance with claim 1, wherein said first slope is formed as to be extend, in said cross section shape on said plane, on an extended part of the straight line running between an emission center of said point-like-light-source and said the other end portion of said first slope, and
said second slope is formed as to be generally vertical with respect to said first slope.

5. An emission device in accordance with claim 4, wherein said at least one second recess portion consists of a set of second recess portions,
said set of second recess portions being arranged concentrically and successively as to surround said first recess portion, and
all of said set of second recess portions, except for one second recess portion that is located at most inner side and is adjacent to said opening-edge of said first recess portion, being configured as to be same as or similar to said one most inner side second recess portion.

6. An emission device in accordance with claim 4, wherein said at least one second recess portion consists of a set of second recess portions,
said set of second recess portions being arranged concentrically and successively as to surround said first recess portion, and
all of said set of second recess portions, except for one second recess portion that is located adjacent to said opening-edge of said first recess portion, being configured as to have first slope inclination that are gradually smaller as compared with first slope inclination of said one second recess, as distance of second recess portions from said first recess portion increases.

7. An emission device in accordance with claim 1, wherein said at least one second recess portion consists of a set of second recess portions,
said set of second recess portions being arranged concentrically and successively as to surround said first recess portion, and
all of said set of second recess portions, except for one second recess portion that is located adjacent to said opening-edge of said first recess portion, being configured as to be same as or similar to said one most inner side second recess portion.

8. An emission device in accordance with claim 1, wherein said at least one second recess portion consists of a set of second recess portions,
said set of second recess portions being arranged concentrically and successively as to surround said first recess portion, and
all of said set of second recess portions, except for one second recess portion that is located adjacent to said opening-edge of said first recess portion, being configured as to have first slope inclination that are gradually smaller as compared with first slope inclination of said one second recess, as distance of second recess portions from said first recess portion increases.

9. An emission device in accordance with claim 1, wherein said light control emission face includes a ring-like first emission face which is near to said reference optical axis and concentric with respect to said reference optical axis and a second emission face which is adjacent to and surrounds said first emission face, a connection part between said first emission face and said second emission face corresponding to a point of inflection of said light control emission face.

10. An emission device in accordance with claim 9, wherein said at least one point-like-light-source consists of a plurality of point-like-light-sources corresponding to each of said first recess portion and said at least one most inner side second recess portion are formed on said back face of said light flux control member.

11. A surface light source device comprising:
an emission device; and
a light diffusion member diffusing light outputted from said emission device,
wherein said emission device is a emission device in accordance with claim 10.

12. A display comprising:
the surface light source device of claim 11; and
an object-to-be-illuminated which is illuminated by light outputted from said surface light source device.

13. A surface light source device comprising:
an emission device; and
a light diffusion member diffusing light outputted from said emission device,
wherein said emission device is a emission device in accordance with claim 9.

14. A display comprising:
the surface light source device of claim 13; and
an object-to-be-illuminated which is illuminated by light outputted from said surface light source device.

15. An emission device in accordance with claim 1, wherein said at least one point-like-light-source consists of a plurality of point-like-light-sources corresponding to each of said first recess portion and said at least one most inner side second recess portion are formed on said back face of said light flux control member.

16. A surface light source device comprising:
an emission device; and
a light diffusion member diffusing light outputted from said emission device,
wherein said emission device is a emission device in accordance with claim 15.

17. A display comprising:
the surface light source device of claim 16; and
an object-to-be-illuminated which is illuminated by light outputted from said surface light source device.

18. A surface light source device comprising:
an emission device; and
a light diffusion member diffusing light outputted from said emission device,
wherein said emission device is a emission device in accordance with claim 1.

19. A display comprising:
the surface light source device of claim 18; and
an object-to-be-illuminated which is illuminated by light outputted from said surface light source device.

* * * * *

UNITED STATES PATENT AND TRADEMARK OFFICE
CERTIFICATE OF CORRECTION

PATENT NO. : 8,251,547 B2  Page 1 of 1
APPLICATION NO. : 12/289797
DATED : August 28, 2012
INVENTOR(S) : Masao Yamaguchi It is certified that error appears in the above-identified patent and that said Letters Patent is hereby corrected as shown below:

Column 1, Line 32, Delete "a plate" and insert -- a plate- --, therefor.

Column 12, Line 20, After "15b2." insert as a new paragraph:

-- First slope 15b1 is generally located on an extended part of straight line 27 running from emitting point 13 to back face side end edge 26 of second slope 15a2 of first ring — like recess portion 15a. --.

Column 17, Line 15 (Approx.), Delete "second" and insert -- Second --, therefor.

Column 17, Line 61, Delete "or" and insert -- of --, therefor.

Signed and Sealed this
Twentieth Day of November, 2012

David J. Kappos
*Director of the United States Patent and Trademark Office*